United States Patent
Kim et al.

(10) Patent No.: US 8,659,734 B2
(45) Date of Patent: Feb. 25, 2014

(54) LIQUID CRYSTAL DISPLAY AND MANUFACTURING METHOD THEREOF

(75) Inventors: Sung-Hoon Kim, Seoul (KR); Yoon-Sung Um, Yongin-si (KR); Joo-Seok Yeom, Seoul (KR)

(73) Assignee: Samsung Display Co., Ltd. (KR)

(*) Notice: Subject to any disclaimer, the term of this patent is extended or adjusted under 35 U.S.C. 154(b) by 24 days.

(21) Appl. No.: 13/215,907

(22) Filed: Aug. 23, 2011

(65) Prior Publication Data
US 2012/0169985 A1    Jul. 5, 2012

(30) Foreign Application Priority Data

Jan. 3, 2011  (KR) .................. 10-2011-0000241
May 11, 2011 (KR) .................. 10-2011-0044010

(51) Int. Cl.
G02F 1/1343    (2006.01)
G02F 1/1333    (2006.01)

(52) U.S. Cl.
USPC .......................................... 349/141; 349/138

(58) Field of Classification Search
USPC ................................................. 349/141, 138
See application file for complete search history.

(56) References Cited

U.S. PATENT DOCUMENTS

| | | | |
|---|---|---|---|
| 7,453,530 B2 | 11/2008 | Paik et al. | |
| 7,724,325 B2 | 5/2010 | Kim | |
| 2002/0149729 A1 | 10/2002 | Nishimura et al. | |
| 2004/0263752 A1* | 12/2004 | Kim | 349/141 |
| 2007/0024791 A1 | 2/2007 | Nishida | |
| 2008/0213472 A1* | 9/2008 | Song | 427/162 |
| 2009/0040449 A1 | 2/2009 | Jo et al. | |
| 2009/0322975 A1* | 12/2009 | Song et al. | 349/46 |

FOREIGN PATENT DOCUMENTS

| | | |
|---|---|---|
| EP | 1 939 673 A1 | 7/2008 |
| JP | 2004-062145 A | 2/2004 |
| KR | 100269351 B1 | 7/2000 |
| KR | 1020040038355 A | 5/2004 |
| KR | 1020040056667 A | 7/2004 |
| KR | 1020040085583 A | 10/2004 |
| KR | 100488934 B1 | 5/2005 |
| KR | 1020060001670 A | 1/2006 |
| KR | 10-0607145 B | 7/2006 |
| KR | 1020060078673 A | 7/2006 |
| KR | 1020070017817 A | 2/2007 |

(Continued)

OTHER PUBLICATIONS

European Search Report corresponding to EP 11191439, dated Apr. 24, 2012, 9 pages.

*Primary Examiner* — Michael Caley
*Assistant Examiner* — Kendrick Hsu
(74) *Attorney, Agent, or Firm* — Innovation Counsel LLP

(57) ABSTRACT

A liquid crystal display, including: a first substrate and a second substrate; a liquid crystal layer; a first data line disposed on the first substrate; a pixel electrode disposed on the first substrate; and a common electrode disposed on the first substrate and overlapping at least a portion of the pixel electrode and the first data line. One of the pixel electrode and the common electrode includes a plurality of branch electrodes spaced apart from each other and the other of has an at least approximately planar shape that is substantially parallel to a surface of at least one of the first substrate and the second substrate. The display can also include a passivation layer having a dielectric constant of about 3.5 or less, and including a first portion disposed between the common electrode and the first data line.

38 Claims, 50 Drawing Sheets

(56) References Cited

FOREIGN PATENT DOCUMENTS

| | | |
|---|---|---|
| KR | 1020070072106 A | 7/2007 |
| KR | 1020080000012 A | 1/2008 |
| KR | 1020080038930 A | 5/2008 |
| KR | 1020080075717 A | 8/2008 |
| KR | 10-0899627 B | 5/2009 |
| KR | 1020090053609 A | 5/2009 |
| KR | 10-0914194 B | 8/2009 |

* cited by examiner

LIQUID CRYSTAL DISPLAY AND MANUFACTURING METHOD THEREOF

CROSS-REFERENCE TO RELATED APPLICATION

This application claims priority to, and the benefit of, both Korean Patent Application No. 10-2011-0000241 filed in the Korean Intellectual Property Office on Jan. 3, 2011 and Korean Patent Application No. 10-2011-0044010 filed in the Korean Intellectual Property Office on May 11, 2011, the entire contents of each of which are incorporated herein by reference.

BACKGROUND OF THE INVENTION (a) Field of the Invention

Embodiments of the present invention relate generally to flat panel displays. More specifically, embodiments of the present invention relate to liquid crystal display configurations and the manufacture thereof.

(b) Description of the Related Art

A liquid crystal display, which is one of the more common types of flat panel displays currently in use, typically includes two sheets of display panels with field generating electrodes (such as a pixel electrode and a common electrode, etc.) formed thereon, and a liquid crystal layer interposed therebetween.

The liquid crystal display generates electric fields in a liquid crystal layer by applying voltage to the field generating electrodes, and determines the direction of liquid crystal molecules of the liquid crystal layer by the generated electric field, thus controlling polarization of incident light so as to display images.

Transmittance of the liquid crystal display may be increased with appropriate control of the liquid crystal molecules.

Meanwhile, each pixel electrode of the liquid crystal display is connected with switching devices that are in turn connected with signal lines such as gate lines, data lines, etc.

The switching device, which is a three-terminal device such as a thin film transistor or the like, transmits a data voltage to a pixel electrode through its output terminal.

In some of these liquid crystal displays, the pixel electrode and the common electrode may be provided on a single display panel. In this case, light leakage may occur in the vicinity of the data lines, due to field distortion caused by a capacitive coupling between the data line and the pixel electrode.

The above information disclosed in this Background section is only for enhancement of understanding of the background of the invention and therefore it may contain information that is not in the prior art.

SUMMARY OF THE INVENTION

The present invention increases the transmittance of a liquid crystal display via a structure in which a pixel electrode and a common electrode are formed on a single display panel, prevents light leakage due to a capacitive coupling between a data line and a pixel electrode, and reduces a load of the data line.

Further, the present invention has been made in an effort to increase field generating efficiency of a liquid crystal layer in its display area.

An exemplary embodiment of the present invention provides a liquid crystal display, including: a first substrate and a second substrate facing each other; a liquid crystal layer interposed between the first substrate and the second substrate; a first data line disposed on the first substrate; a pixel electrode disposed on the first substrate for receiving a data voltage from the first data line; and a common electrode disposed on the first substrate and overlapping at least a portion of the pixel electrode and the first data line. One of the pixel electrode and the common electrode includes a plurality of branch electrodes spaced apart from each other and the other of the pixel electrode and the common electrode has an at least approximately planar shape.

Also included may be a passivation layer having a dielectric constant of about 3.5 or less and including a first portion disposed between the common electrode and the first data line.

A thickness of the passivation layer may be in a range from about 0.5 μm to about 3.0 μm.

The passivation layer may include an organic material.

The liquid crystal display may further include: a second data line adjacent to the first data line and disposed in the same layer as the first data line, wherein the passivation layer may further include a second portion disposed between the common electrode and the second data line, and the first portion and the second portion may be spaced apart from each other.

The liquid crystal display may further include a second data line adjacent to the first data line and disposed in the same layer as the first data line, wherein the passivation layer may further include a third portion disposed between the first data line and the second data line and a thickness of the first portion may be greater than a thickness of the second portion.

At least one of the pixel electrode and the common electrode may include a transparent conductive material.

Another exemplary embodiment of the present invention provides a method of manufacturing a liquid crystal display, including: forming a data conductor on a substrate, the data conductor including a first data line; forming a pixel electrode on the substrate; and forming a common electrode on the substrate, the common electrode overlapping at least a portion of the pixel electrode and the first data line. One of the pixel electrode and the common electrode includes a plurality of branch electrodes spaced apart from each other and the other of the pixel electrode and the common electrode has an at least approximately planar shape.

The forming of the passivation layer may further include: depositing an organic material between the common electrode and the first data line; and forming a passivation pattern by exposing the deposited organic material using a photo mask, the passivation pattern including a second portion overlapping the first data line and a third portion having a thickness less than that of the second portion.

The photo mask may include a transparent area configured to transmit light, an opaque area configured to block light, and a translucent area configured to transmit a portion of incident light.

The forming of the data conductor may further include forming a second data line adjacent to the first data line and the second portion of the passivation pattern may overlap the second data line.

The manufacturing method of a liquid crystal display may further include: etching the passivation pattern and ashing the passivation pattern.

The ashing of the passivation pattern may include removing the third portion.

The manufacturing method of a liquid crystal display may further include: forming an insulating layer under the passivation layer, wherein the etching of the passivation pattern may further include etching the insulating layer.

A thickness of the passivation layer may be in a range from about 0.5 μm to about 3.0 μm, and at least one of the pixel electrode and the common electrode may include a transparent conductive material.

Another exemplary embodiment of the present invention provides a liquid crystal display, comprising: a first substrate and a second substrate facing each other; a liquid crystal layer interposed between the first substrate and the second substrate; a first data line disposed on the first substrate; a common electrode disposed on the first data line and overlapping the first data line, the common electrode having an at least approximately planar shape; a pixel electrode disposed on the common electrode for receiving a data voltage from the first data line, the pixel electrode including a plurality of branch electrodes spaced apart from each other; and a passivation layer disposed on the first substrate, the passivation layer having a dielectric constant of about 3.5 or less, the passivation layer further having a first portion disposed between the first data line and the common electrode.

A thickness of the passivation layer may be in a range from about 0.5 μm to about 3.0 μm.

The passivation layer may include an organic material.

The liquid crystal display may further comprise a second data line adjacent to the first data line and disposed in the same layer as the first data line, wherein the passivation layer further includes a second portion disposed between the common electrode and the second data line, and the first portion and the second portion are spaced apart from each other.

Another exemplary embodiment of the present invention provides a method of manufacturing a liquid crystal display, the method comprising: forming a data conductor on a substrate, the data conductor including a first data line; forming a common electrode on the first data line, the common electrode overlapping the first data line; forming a pixel electrode on the common electrode; forming a passivation layer having a first portion disposed between the first data line and the common electrode and having a dielectric constant of about 3.5 or less, wherein the pixel electrode includes a plurality of branch electrodes spaced apart from each other and the common electrode has an at least approximately planar shape.

The forming a passivation layer may further include: depositing an organic material over the first data line before the forming the common electrode; and forming a passivation pattern by exposing the deposited organic material using a photo mask, the passivation pattern including a second portion overlapping the first data line and a third portion having a thickness less than that of the second portion.

The forming a data conductor may further include forming a second data line adjacent to the first data line, the second portion of the passivation pattern overlapping the second data line.

The method may further comprise etching the passivation pattern, and ashing the passivation pattern.

The ashing the passivation pattern may further include removing the third portion.

Another exemplary embodiment of the present invention provides a liquid crystal display, comprising: a first substrate and a second substrate facing each other; a liquid crystal layer interposed between the first substrate and the second substrate; a first data line disposed on the first substrate; a common electrode disposed on the first substrate and overlapping the first data line; and a pixel electrode disposed on the common electrode for receiving a data voltage from the first data line, the pixel electrode including a plurality of branch electrodes spaced apart from each other.

The liquid crystal display may further comprise a passivation layer including a first portion disposed between the first data line and the common electrode, the passivation layer comprising an organic material.

The passivation layer may have a dielectric constant of about 3.5 or less.

A thickness of the passivation layer may be in a range from about 0.5 μm to about 3.0 μm.

The liquid crystal display may further comprise a second data line adjacent to the first data line and disposed in the same layer as the first data line, wherein the passivation layer further includes a second portion disposed between the common electrode and the second data line, and the first portion and the second portion are spaced apart from each other.

The passivation layer may further include a third portion connecting the first portion and the second portion so that the passivation layer may at least partially cover the first data line and the second data line.

The liquid crystal display may further comprise a light blocking member disposed on the second substrate.

The light blocking member may be positioned between two adjacent pixel electrodes, the two adjacent pixel electrodes being disposed on opposing sides of the first data line.

A width of the light blocking member may be equal to or less than a distance between the two adjacent pixel electrodes.

The common electrode may have an at least approximately planar shape that is substantially parallel to a surface of at least one of the first substrate and the second substrate.

Another exemplary embodiment of the present invention provides a liquid crystal display, comprising: a first substrate and a second substrate facing each other; a liquid crystal layer disposed between the first substrate and the second substrate; a first data line disposed on the first substrate; a first pixel electrode disposed on the first substrate and in electrical communication with the first data line so as to be configured to receive a data voltage from the first data line; a common electrode disposed on the first substrate and overlapping the pixel electrode and the first data line; and a first passivation layer disposed on the first data line and including an organic material, wherein one of the first pixel electrode and the common electrode includes a plurality of branch electrodes spaced apart from each other, and the other of the first pixel electrode and the common electrode has an at least approximately planar shape that is substantially parallel to a surface of at least one of the first substrate and the second substrate, and the first passivation layer includes a first portion covering the first data line.

The liquid crystal display may further comprise a second data line adjacent to the first data line, wherein the first passivation layer further includes a second portion covering the second data line, and the first portion and the second portion are spaced apart from each other.

The first passivation layer may be disposed between the first data line and the common electrode.

The liquid crystal display may further comprise: a second pixel electrode adjacent to the first pixel electrode, and a light blocking member that covers an area between the first pixel electrode and the second pixel electrode.

A portion of the light blocking member positioned between the first pixel electrode and the second pixel electrode has a width that may be equal to or smaller than a distance between the first pixel electrode and the second pixel electrode.

The first pixel electrode may be disposed on the common electrode, and the first pixel electrode may include a plurality of branch electrodes and the common electrode has an approximately planar shape.

The thickness of the first portion may be thicker than that of the third portion.

The thickness of the first passivation layer may be in a range from about 0.5 µm to about 3.0 µm.

According to the exemplary embodiments of the present invention, by forming an electrode having a generally planar shape and an electrode including branch electrodes on a single substrate, the efficiency of the liquid crystal molecules motion may be increased, thereby making it possible to increase the transmittance of the liquid crystal display.

Further, a portion of the common electrode covers the data line to reduce light leakage, and by interposing a passivation layer having low permittivity or a passivation layer including an organic material between the data line and the common electrode, the parasitic capacitance of the data line and the common electrode may be decreased, thereby making it possible to reduce the signal delay of the data line.

In addition, the passivation layer is disposed only between the data line and the common electrode or, alternatively, the passivation layer disposed in the display area is formed to be thin, thereby making it possible to increase the field generating efficiency in the liquid crystal layer and to prevent defects of the alignment layer or wiring defects due to a step difference in height due to the passivation layer.

DETAILED DESCRIPTION OF THE EMBODIMENTS

Figure 1:
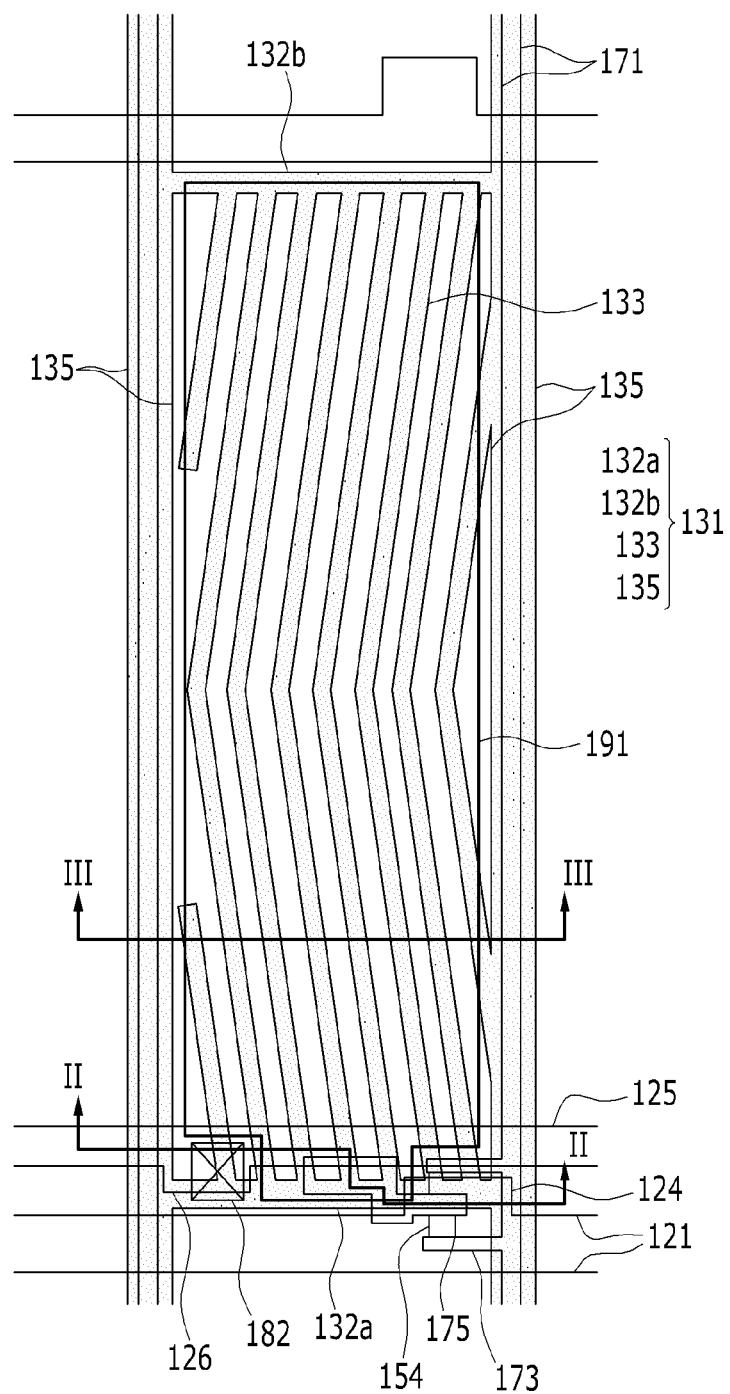
FIG. 1 is a layout view of one pixel of a liquid crystal display according to an exemplary embodiment of the present invention.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

First, a liquid crystal display according to an exemplary embodiment of the present invention will be described with reference to FIGS. 1, 2, 3, 4, and 5.

Figure 2:
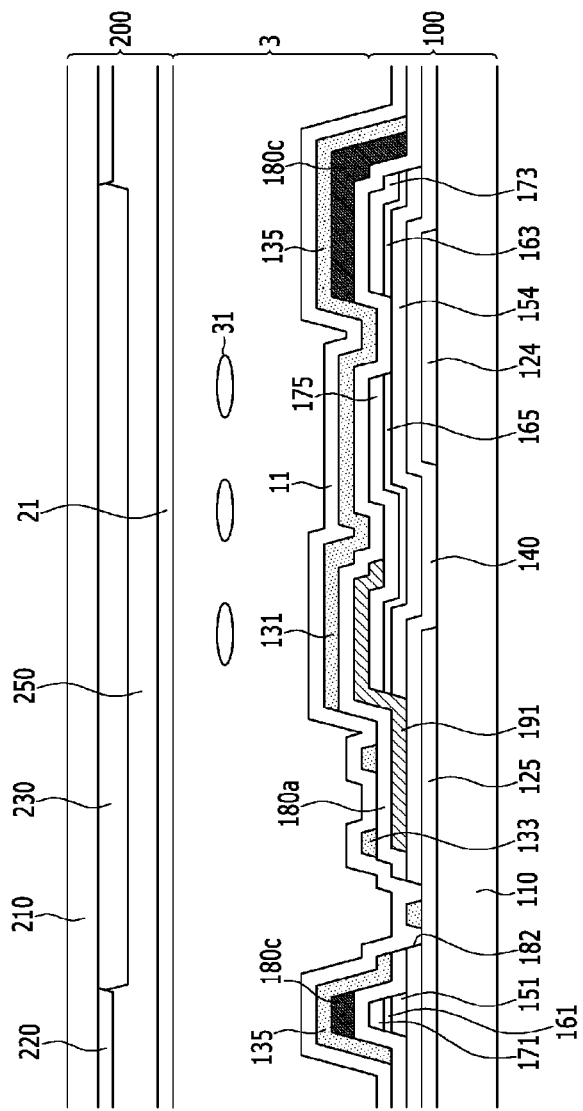
FIGS. 2 and 3 each show an exemplary embodiment of cross-sectional views taken along line II-II and line III-III of the liquid crystal display of FIG. 1.
Figure 3:
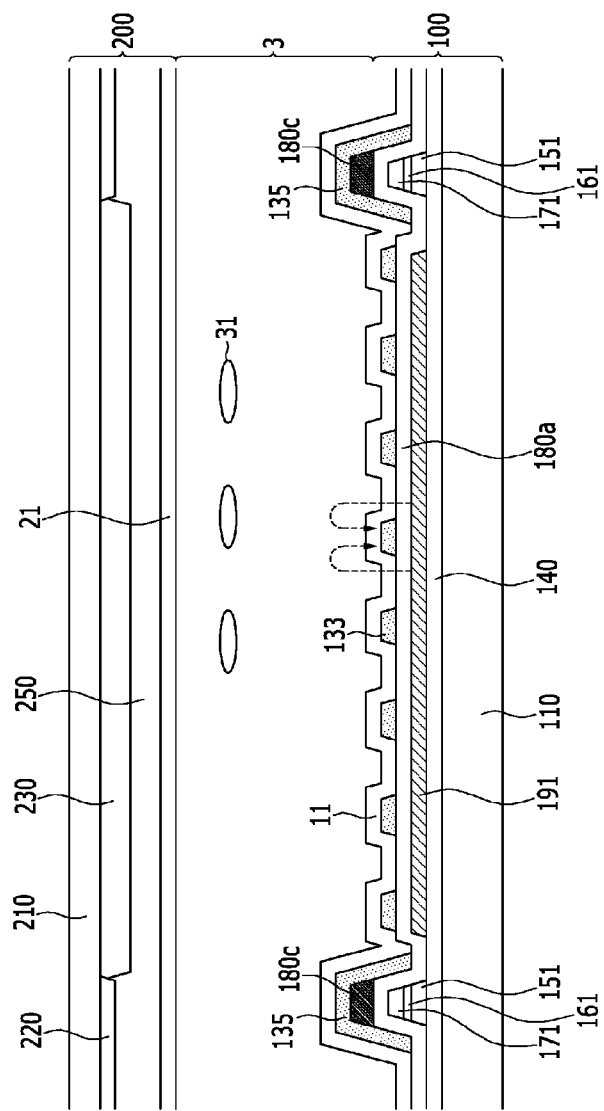
Figure 4:
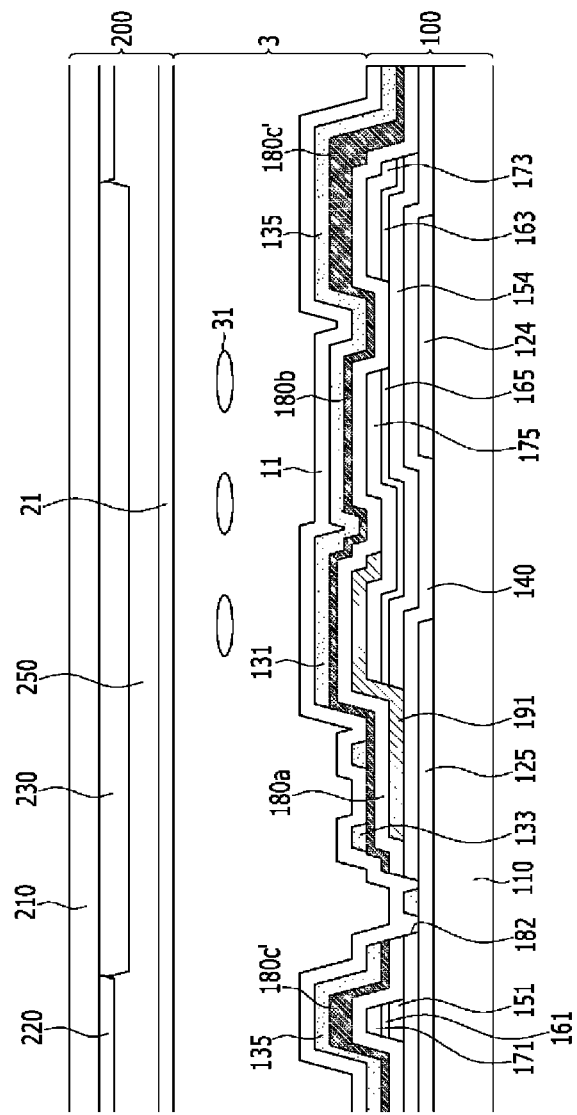
FIGS. 4 and 5 each show another exemplary embodiment of cross-sectional views taken along line II-II and line III-III of the liquid crystal display of FIG. 1.
Figure 5:
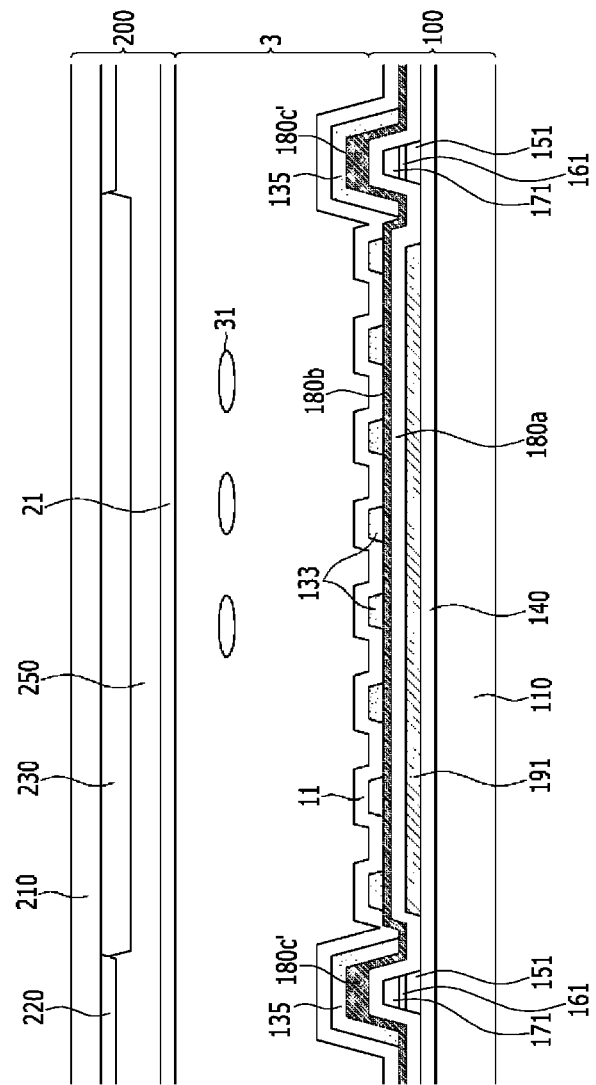

FIG. 1 is a layout view of one pixel of a liquid crystal display according to an exemplary embodiment of the present invention, FIGS. 2 and 3 respectively show cross-sectional views taken along line II-II and line III-III of one embodiment of the liquid crystal display of FIG. 1, and FIGS. 4 and 5 respectively show cross-sectional views taken along line II-II and line III-III of another embodiment of the liquid crystal display of FIG. 1.

The liquid crystal display of these embodiments includes a lower display panel 100 and an upper display panel 200 facing each other, as well as a liquid crystal layer 3 interposed between the two display panels 100 and 200.

First, the lower display panel 100 will be described below.

A plurality of gate conductors, including a plurality of gate lines 121 and a plurality of common voltage lines 125, are formed on an insulating substrate 110.

The gate lines 121 transmit gate signals and substantially extend in a horizontal direction. Each gate line 121 includes a plurality of gate electrodes 124 that protrude substantially upwardly.

The common voltage line 125 may transmit a predetermined voltage such as common voltage Vcom, may substantially extend in a horizontal direction, and may be substantially parallel with the gate line 121.

Each common voltage line 125 may include a plurality of extensions 126.

A gate insulating layer 140 is formed on the gate conductors 121 and 125. The gate insulating layer 140 may be made of inorganic insulating material or the like, examples being silicon nitride (SiNx), silicon oxide (SiOx), or the like.

A plurality of linear semiconductors 151 are formed on the gate insulating layer 140. Each linear semiconductor 151 substantially extends in a vertical direction and the plurality of semiconductor protrusions 154 extends toward the gate electrode 124 from each linear semiconductor 151.

A plurality of linear ohmic contacts 161 and a plurality of island ohmic contacts 165 are formed on the linear semiconductor 151. The linear ohmic contact 161 has a plurality of protrusions 163 extending toward the gate electrode 124. The protrusions 163 and the island ohmic contacts 165 are formed in pairs facing each other over the gate electrode 124, and are disposed on the semiconductor protrusion 154. The ohmic contacts 161 and 165 are made of a material such as n+ hydrogenated amorphous silicon, etc., doped with n-type impurity such as phosphorus, etc., at high concentration, or may be made of silicide.

Data conductors, including a plurality of data lines 171 and a plurality of drain electrodes 175, are formed on the ohmic contacts 161 and 165.

The data lines 171 transmit data signals and substantially extend in a vertical direction, to intersect the gate lines 121 and the common voltage line 125. Each data line 171 includes a plurality of source electrodes 173 extending toward the gate electrode 124.

The drain electrode 175 includes a generally bar-shaped end facing the source electrode 173 and another end having a wider area than the bar-shaped end.

The gate electrode 124, the source electrode 173, and the drain electrode 175 collectively form a switching device, i.e., a thin film transistor (TFT), together with the semiconductor protrusion 154.

The linear semiconductor 151 may have substantially the same planar shape as the data line 171, the drain electrode 175, and the ohmic contacts 161 and 165 disposed thereunder, except for the semiconductor protrusion 154 on which the thin film transistor is disposed. Throughout the description and the claims, "planar shape" may mean that the element in question has a particular shape in a plane which is substantially parallel to a surface of the insulating substrate 110. In other words, "planar shape" may mean that the related element has a particular shape in a plane which is substantially parallel to a plane including two data lines 171, a plane including two gate lines 121, or a plane including both the data line 171 and the gate line 121.

Pixel electrodes 191 are formed on the data conductors 171 and 175 and the exposed semiconductor protrusion 154.

The pixel electrode 191 may be made of a transparent conductive material such as ITO, IZO, or the like.

The pixel electrode 191 is disposed on the drain electrode 175 of the thin film transistor to cover and directly contact a portion of the drain electrode 175, and also includes a portion contacting the gate insulating layer 140. The pixel electrode 191 receives the data voltage from the drain electrode 175.

Alternatively, a passivation layer (not shown) made of an inorganic material or an organic material may be further disposed on the data conductors 171 and 175 and the exposed semiconductor protrusion 154, and the pixel electrode 191 may be disposed on the passivation layer. In this case, the pixel electrode 191 may receive the data voltage from the drain electrode 175 through a contact hole (not shown) in the passivation layer.

The pixel electrode 191 has a planar shape that fills most of the area surrounded by the gate line 121 and the data line 171.

The general shape of the pixel electrode 191 may be a rectangular shape having four sides approximately parallel with the gate line 121 and the data line 171. Edges of the pixel electrode 191 lying near the thin film transistor may be chamfered, but the shape of the pixel electrode 191 is not limited thereto.

A first passivation layer 180a is formed on the pixel electrode 191, the data conductors 171 and 175, and the exposed semiconductor protrusion 154. The first passivation layer 180a may be made of an inorganic insulating material or an organic insulating material.

A number of contact holes 182 are formed on the first passivation layer 180a and the gate insulating layer 140 in order to expose a portion of the common voltage line 125, for example, a portion of the extension 126.

Referring to FIGS. 2 and 3, a second passivation layer 180c is formed on the first passivation layer 180a. The second passivation layer 180c according to the exemplary embodiment is formed along the data line 171, covering the data line 171.

The second passivation layer 180c may be made of an organic material or an inorganic material, and its relative dielectric constant may be about 3.5 or less. There may be about 10% deviation in the relative dielectric constant of the second passivation layer 180c, according to the measuring method used. When the second passivation layer 180c includes a colored material such as a material for color filters, the relative dielectric constant of the second passivation layer 180c may be increased to about 4.5 considering the relative dielectric constant of the pigment or dye included in the colored material. In particular, it is preferable that the dielectric constant of the second passivation layer 180c is lower than that of the first passivation layer 180a. Comparing the relative permittivity, the dielectric constant of the second passivation layer 180c may be lower than that of the lower first passivation layer 180a or the gate insulating layer 140.

The thickness of the second passivation layer 180c may be in a range from about 0.5 μm to about 3.0 μm. The lower the dielectric constant of the second passivation layer 180c is, the thinner its thickness may be.

Alternatively, referring to FIGS. 4 and 5, a second passivation layer 180b is formed on the first passivation layer 180a.

The second protective layer 180b is formed on the whole surface of the first passivation layer 180a, and thus, it is also disposed between two adjacent data lines 171.

Further, the contact hole 182 of the first passivation layer 180a and the gate insulating layer 140 is extended to the second passivation layer 180b so that the contact hole 182 is formed through the gate insulating layer 140, the first passivation layer 180a and the second passivation layer 180b.

The second passivation layer 180b covers the data line 171, and includes a thicker portion 180c' disposed along the data line 171.

In the exemplary embodiment shown in FIGS. 4 and 5, the first passivation layer 180a may be omitted.

In addition, the characteristics of the second passivation layer 180b are generally the same as the characteristics of the second passivation layer 180c shown in FIGS. 2 and 3 described above.

The plurality of common electrodes 131 are formed on the second passivation layers 180c and 180b.

The common electrode 131 may be made of a transparent conductive material such as ITO, IZO, or the like.

Each common electrode 131 includes vertical parts 135 covering the data line 171 and the second passivation layers 180c and 180b, a plurality of branch electrodes 133 spaced apart from each other while being disposed between the two vertical parts 135, as well as a lower horizontal part 132a and an upper horizontal part 132b connecting the ends of the plurality of branch electrodes 133.

The vertical part 135 is substantially parallel with the data line 171 and overlaps the data line 171 so as to cover the data line 171. The lower and upper horizontal parts 132a and 132b may substantially parallel with the gate line 121.

The plurality of branch electrodes 133 may be substantially parallel with each other and form a bevel angle with respect to the extending direction of the gate line 121, wherein the bevel angle may be 45 degrees or more.

The upper branch electrode 133 and the lower branch electrode 133 may generally have an inversion symmetry to each other relative to the virtual horizontal central line of the common electrode 131.

The adjacent common electrodes 131 are connected to each other through a vertical part 135.

The common electrode 131 partially overlaps with the pixel electrode 191. In particular, at least two adjacent branch electrodes 133 of the common electrode 131 overlap with the pixel electrode 191.

The common electrode 131 receives a predetermined voltage, such as the common voltage Vcom, from the common voltage line 125 through the contact hole 182.

Next, the upper display panel 200 will be described. A light blocking member 220 and a color filter 230 are formed on an insulating substrate 210.

The light blocking member 220 is disposed between adjacent pixel electrodes 191 and prevents light leakage between the pixel electrodes 191, and defines an opening area facing the pixel electrode 191. The light blocking member 220 includes a portion covering the area between two adjacent pixel electrodes 191 that are disposed on either side of the data line 171. Therefore, the light blocking member 220 may cover the data line 171 extending along the area between the two adjacent pixel electrodes 191. The width of the light blocking member 220 may be generally equal to or smaller than a distance between the two adjacent pixel electrodes 191. For example, a distance between an edge of the light blocking member 220 and an edge of the adjacent pixel electrode 191 may be 0 (zero) or more (when viewed along a normal to the upper surface of substrate 110), and may be smaller than a distance between the two adjacent pixel electrodes 191. The light blocking member 220 prevents light from leaking out between the adjacent pixel electrodes 191.

The color filter 230 is formed in the area surrounded by the light blocking member 220, and may extend long along a column of the pixel electrode 191. Each color filter 230 may display one of a primary color such as red, green, and blue, or the like.

An overcoat 250 may be further formed on the light blocking member 220 and the color filter 230.

Alignment layers 11 and 21 may be applied on the inner surfaces of the two display panels 100 and 200 (i.e., on the surfaces of panels 100, 200 that face each other), and may be horizontal alignment layers.

In the exemplary embodiment shown in FIG. 1, the branch electrode 133 of the common electrode 131 is inclined so as to be closer to a vertical direction, i.e. the direction along which the data line 171 extends. The alignment direction of the alignment layers 11 and 21 may be a vertical direction.

The liquid crystal layer 3 interposed between the lower display panel 100 and the upper display panel 200 includes a liquid crystal molecule 31, wherein the liquid crystal molecule 31 may be aligned so that a major axis thereof is formed to be generally horizontal with respect to the surfaces of the two display panels 100 and 200 when an electric field is not present.

When a data voltage is applied to the pixel electrode 191 and a common voltage Vcom is applied to common electrode 131, an electric field is generated in the liquid crystal layer 3, thereby determining the direction of the liquid crystal molecule 31 of the liquid crystal layer 3 to display the corresponding image.

In particular, the pixel electrode 191 is substantially planar in the display area surrounded by the data line 171 and the gate line 121, such that it can control the directions of the liquid crystal molecules 31 in most of the display area (other than the portion around the central line of the branch electrodes 133 of the common electrode 131) by the electric field represented by the arrow in FIG. 3, thereby increasing the transmittance of the liquid crystal display. Particularly, since electric fields may be generated even above the branch electrodes 133 of the common electrode due to the pixel electrode 191 having a planar shape, the transmittance of the liquid crystal display according to the present embodiment of the present invention may be further increased, as compared to pixel electrodes that have branches alternatingly disposed with the branch electrodes of the common electrode (IPS mode).

In the exemplary embodiment of the present invention, the vertical part 135 of the common electrode 131 overlaps the data line 171 to cover the data line 171 in a width direction, thereby making it possible to reduce crosstalk between the data line 171 and the pixel electrode 191 and to reduce light leakage due to the parasitic capacitance between the data line 171 and the adjacent pixel electrode 191. That is, at least a portion of the vertical part 135 of the common electrode 131 is placed between the pixel electrode 191 and data line 171, reducing crosstalk and light leakage between the data line 171 and pixel electrode 191.

In addition, according to the exemplary embodiment of the present invention, the second passivation layers 180c and 180b, having low permittivity, are interposed between the data line 171 and the vertical part 135 of the upper common electrode 131, thereby making it possible to lower the parasitic capacitance between the data line 171 and the upper common electrode 131, so as to reduce the signal delay of the data line 171.

In particular, as described in the exemplary embodiment of FIGS. 2 and 3, the second passivation layer 180c is formed only on the upper portion of the data line 171. Alternatively, as described in the exemplary embodiment of FIGS. 4 and 5, the second passivation layer 180b is thicker above, or proximate to, the data line 171 and thinner elsewhere. In this manner, the pixel electrode 191 disposed on the lower layer of the second passivation layers 180c and 180b can increase the field generating efficiency of the display.

In addition, when the permittivity of the second passivation layers 180c and 180b is reduced, the thickness thereof may be further reduced, such that the field generating efficiency may be further increased in the display area, thereby making it possible to further increase the transmittance.

This configuration also acts to prevent defects of the alignment layer due to a step difference in height, and wiring defects such as disconnections, by lowering the thickness of the second passivation layers 180c and 180b.

In the exemplary embodiment of the present invention, the position of the second passivation layers 180c and 180b that have a relatively low dielectric constant is not limited to those shown in the exemplary embodiments described in FIGS. 1 to 5. In particular, they may be disposed in any layer between the data line 171 and the common electrode 131.

Next, a liquid crystal display according to another exemplary embodiment of the present invention will be described with reference to FIGS. 6, 7, and 8.

The same components as the above-mentioned exemplary embodiments are denoted by the same reference numerals, and description thereof will be largely omitted.

Figure 6:
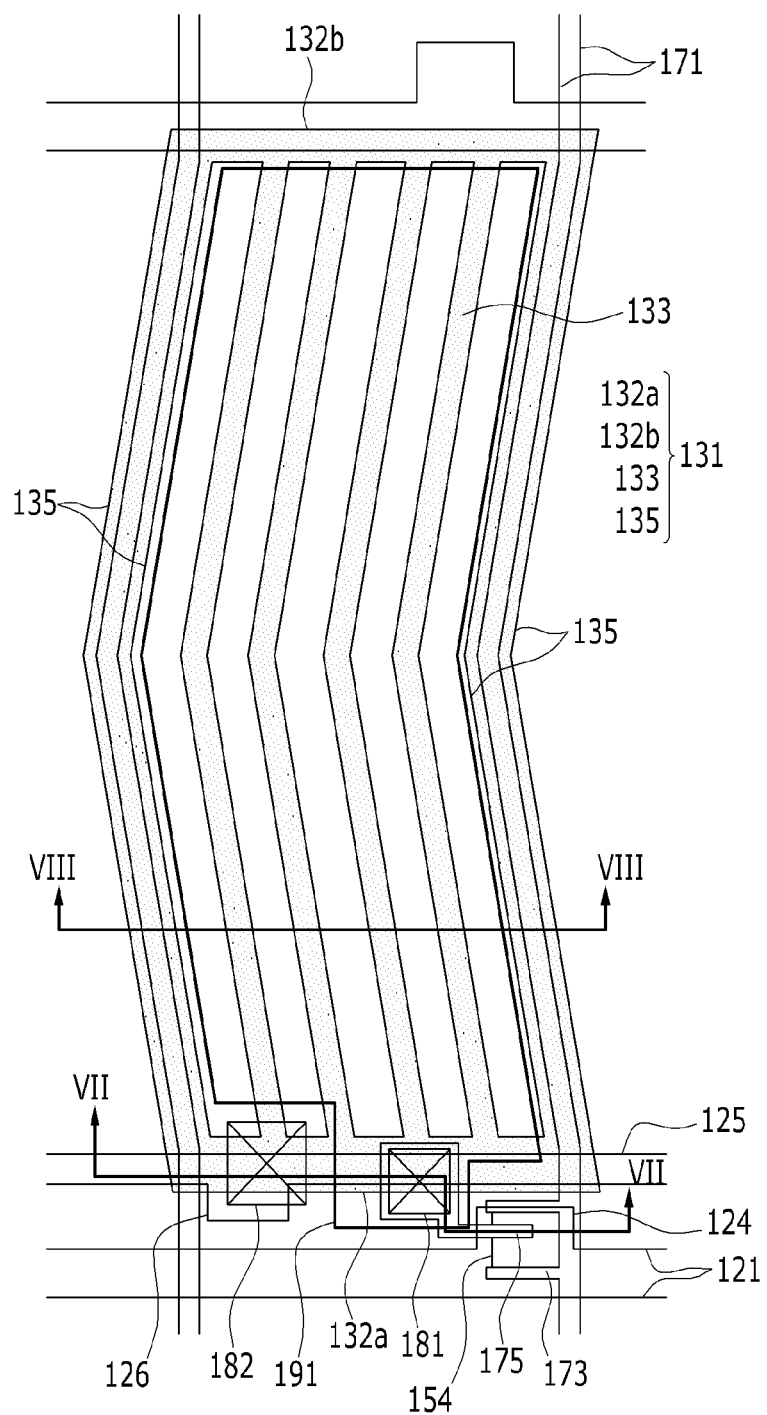
FIG. 6 is a layout view of one pixel of the liquid crystal display according to the exemplary embodiment of the present invention.
Figure 7:
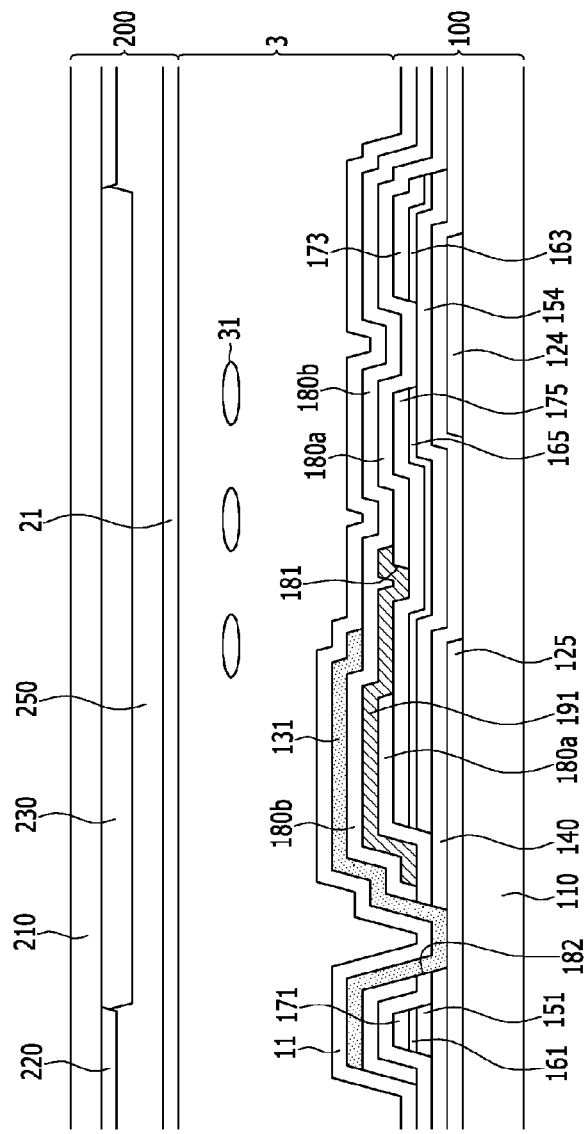
FIGS. 7 and 8 each are cross-sectional views taken along line VII-VII and line VIII-VIII of the liquid crystal display of FIG. 6.
Figure 8:
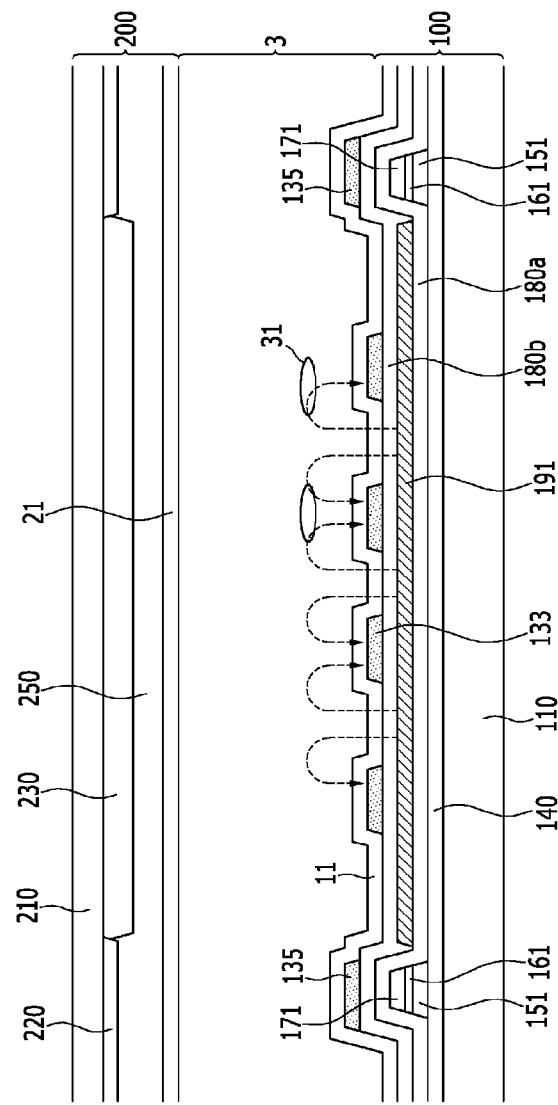

FIG. 6 is a layout view of one pixel of the liquid crystal display according to this exemplary embodiment of the present invention, and FIGS. 7 and 8 each are cross-sectional views taken along line VII-VII and line VIII-VIII of the liquid crystal display of FIG. 6.

This exemplary embodiment of the present invention is similar to the exemplary embodiment shown in FIGS. 1 to 5, but with differences in the structure of the data line 171, the pixel electrode 191, the common electrode 131, and the interlayer insulating layer lying therebetween.

Differences from the exemplary embodiments shown in FIGS. 1 to 5 will be mainly described.

The data line 171 according to the exemplary embodiment of the present invention is bent in periodic manner, thus forming a bevel angle with respect to the extending direction of the gate line 121.

The bevel angle of the data line 171 and the extending direction of the gate line 121 may be about 45 degrees or more.

The first passivation layer 180a is formed on the data conductors 171 and 175 and the exposed semiconductor protrusion 154, and the pixel electrode 191 is formed thereon.

The first passivation layer 180a includes the contact hole 181 exposing a portion of the drain electrode 175, and the pixel electrode 191 is electrically connected to the drain electrode 175 through the contact hole 181.

The pixel electrode 191 has a generally planar shape filling most of the area surrounded by the gate line 121 and the data line 171, and has a side almost parallel with the gate line 121 and the data line 171.

Vertical sides of the pixel electrode 191 are bent similar to that of the data line 171 so as to lie generally parallel to the data lines 171, and both sides may be chamfered, although the invention is not necessarily limited to such configurations.

The second passivation layer 180b is formed on the pixel electrode 191, and the common electrode 131 is formed thereon.

The plurality of contact holes 182 are formed on the gate insulating layer 140, the first passivation layer 180a, and the second passivation layer 180b in order to expose at least a portion of the extension 126 of the common voltage line 125.

The common electrode 131 is electrically connected to the common voltage line 125 through the contact hole 182 to receive a predetermined voltage, such as the common voltage Vcom, etc., from the common voltage line 125.

The common electrode 131 includes vertical parts 135 bent while overlapping the data line 171 to cover the data line 171 in a width direction, and a plurality of branch electrodes 133 spaced apart from each other while being disposed between the two vertical parts 135 and extending substantially parallel to the vertical part 135, as well as a lower horizontal part 132a and an upper horizontal part 132b connecting the ends of the plurality of branch electrodes 133.

The vertical part 135 of the common electrode 131 overlaps with the data line 171 to cover the data line 171 in a width direction.

The first passivation layer 180a and the second passivation layer 180b are disposed between the data line 171 and the common electrode 131. At least one of these passivation layers may be made of an organic insulating material or an inorganic insulating material such as SiOC, or a compound of the organic insulating material and the inorganic insulating material, etc., and the dielectric constant thereof may be about 3.5 or less. There may be about 10% deviation in such relative dielectric constant of the at least one of the passivation layers.

The dielectric constant of the first passivation layer 180a or the second passivation layer 180b may be lower than the dielectric constant of the gate insulating layer 140.

The thickness of the first passivation layer 180a or the second passivation layer 180b may be in a range from about 0.5 μm to about 3.0 μm.

In addition, any one or more characteristics and effects of the second passivation layers 180c and 18b of the exemplary embodiments of FIGS. 1 and 5 described above may also be applied to the first passivation layer 180a or the second passivation layer 180b of this embodiment.

Next, the liquid crystal display according to a further embodiment of the present invention will be described with reference to FIGS. 9, 10, and 11.

The same components as the above-mentioned exemplary embodiments are denoted by the same reference numerals, and any redundant description thereof will be omitted.

Figure 9:
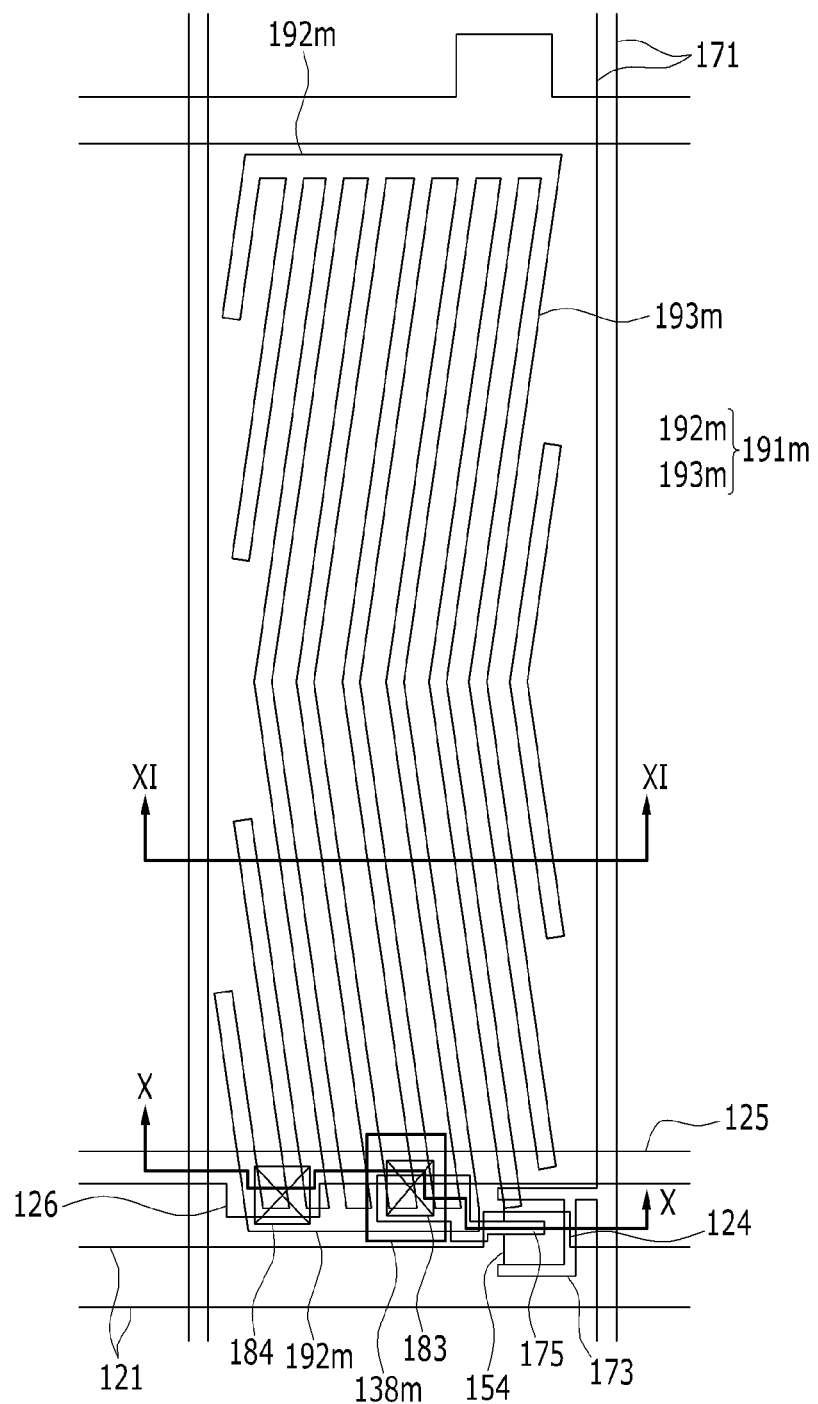
FIG. 9 is a layout view of one pixel of the liquid crystal display according to the exemplary embodiment of the present invention.
Figure 10:
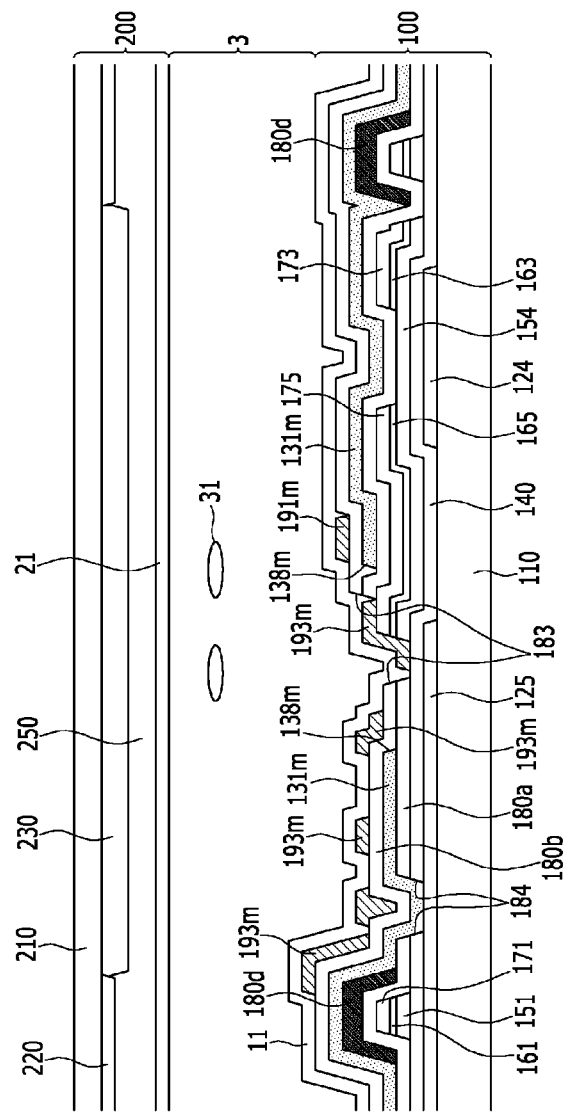
FIGS. 10 and 11 each are cross-sectional views taken along line X-X and line XI-XI of the liquid crystal display of FIG. 9.
Figure 11:
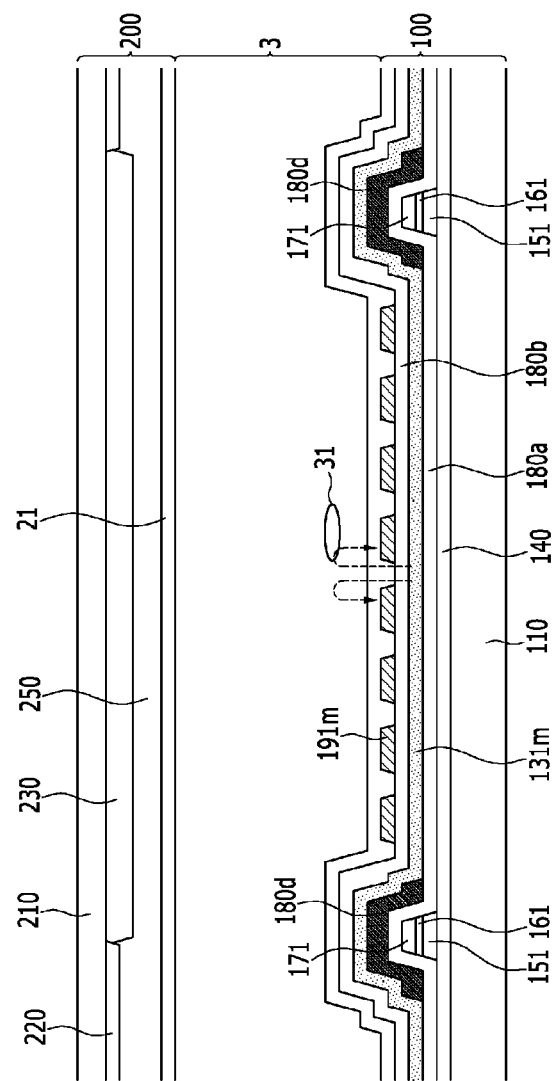

FIG. 9 is a layout view of one pixel of the liquid crystal display of this embodiment of the present invention, and FIGS. 10 and 11 each are cross-sectional views taken along line X-X and line XI-XI of the liquid crystal display of FIG. 9.

This embodiment of the present invention is similar to the exemplary embodiment shown in FIGS. 1 to 5, but contains differences in the structure of the pixel electrode 191, the common electrode 131, and the interlayer insulating layer positioned therebetween.

Differences between the exemplary embodiments shown in FIGS. 1 to 5 will primarily be described.

The first passivation layer 180a is formed on the data conductors 171 and 175 and the exposed semiconductor protrusion 154, and a third passivation layer 180d is formed thereon. The third passivation layer 180d is formed along the data line 171, to cover the data line 171.

The characteristics of the third passivation layer 180d are substantially the same as those of the second passivation layer 180b of the exemplary embodiment of FIGS. 1 to 3 described above, and therefore any detailed description thereof will be omitted.

The third passivation layer 180d may be formed on substantially the entire surface of the substrate 110 as well as between the two adjacent data lines 171, like the second passivation layer 180b of the embodiment of FIGS. 1, 4, and 5 described above. In this case, the third passivation layer 180*d* may be thicker where it overlaps the data line 171.

A common electrode 131*m* is formed on the first passivation layer 180*a* and the third passivation layer 180*d*.

The first passivation layer 180*a* and the gate insulating layer 140 include the contact hole 184 which exposes at least a portion of the extension 126 of the common voltage line 125, and the common electrode 131*m* is electrically connected with the common voltage line 125 through the contact hole 184 to receive a predetermined voltage such as the common voltage Vcom from the common voltage line 125.

The common electrode 131*m* has a generally planar shape and is formed on substantially the entire surface of the substrate 110 over the plurality of pixels, unlike the above-mentioned exemplary embodiment.

The second passivation layer 180*b* is formed on the common electrode 131*m*, and the pixel electrode 191*m* is formed thereon.

The first passivation layer 180*a* and the second passivation layer 180*b* are provided with a plurality of contact holes 183 to expose a portion of the drain electrode 175.

The pixel electrode 191*m* includes a plurality of branch electrodes 193*m* that extend substantially parallel with each other and that are spaced apart from each other, as well as lower and upper horizontal parts 192*m* connecting the end portions of the branch electrodes 193*m*.

When a data voltage is applied to the pixel electrode 191*m* and a common voltage is applied to the common electrode 131*m*, an electric field is generated in the liquid crystal layer 3.

The pixel electrode 191*m* of this embodiment of the present invention at least partially overlaps the common electrode 131*m*. In particular, at least two adjacent branch electrodes 193*m* of the pixel electrode 191*m* overlap the planar-shaped common electrode 131*m*.

In this embodiment of the present invention, the pixel electrode 191*m* is disposed on the common electrode 131*m*, and the common electrode 131*m* covers a number of data lines 171 at a time and also overlaps the data lines 171.

Therefore, as in the above exemplary embodiment, it is possible to reduce crosstalk between the data line 171 and the pixel electrode 191 and to reduce light leakage due to a parasitic capacitance between the data line 171 and the neighboring pixel electrode 191.

In addition, since the third passivation layer 180*d* has a relatively low permittivity and is interposed between the data line 171 and the common electrode 131*m*, the parasitic capacitance between the data line 171 and the common electrode 131*m* may be decreased, thereby making it possible to reduce the signal delay of the data line 171.

Further, characteristics and effects of the third passivation layer 180*d* may be substantially the same as the second passivation layers 180*c* and 180*b* of the exemplary embodiment shown in FIGS. 1 to 5 described above.

Unlike the above-described several embodiments, the common electrode transmitting the common voltage may be disposed directly on the substrate 110, or may be disposed in a layer under the data line 171. Even in this case, the common electrode may be formed to overlap the data line, so as to prevent light leakage of in liquid crystal display. Additionally, the insulating layer may have a relatively low dielectric constant and may be disposed between the data line and the common electrode to reduce the signal delay of the data line.

In addition, the field generating efficiency may be increased in the liquid crystal layer, and defects due to a step difference may be reduced, by reducing the thickness of the insulating layer disposed between the data line and the common electrode.

Next, a liquid crystal display according to a still further embodiment of the present invention will be described with reference to FIGS. 12, 13, and 14.

The same components as the above-mentioned exemplary embodiments are denoted by the same reference numerals, and description thereof will be omitted.

Figure 12:
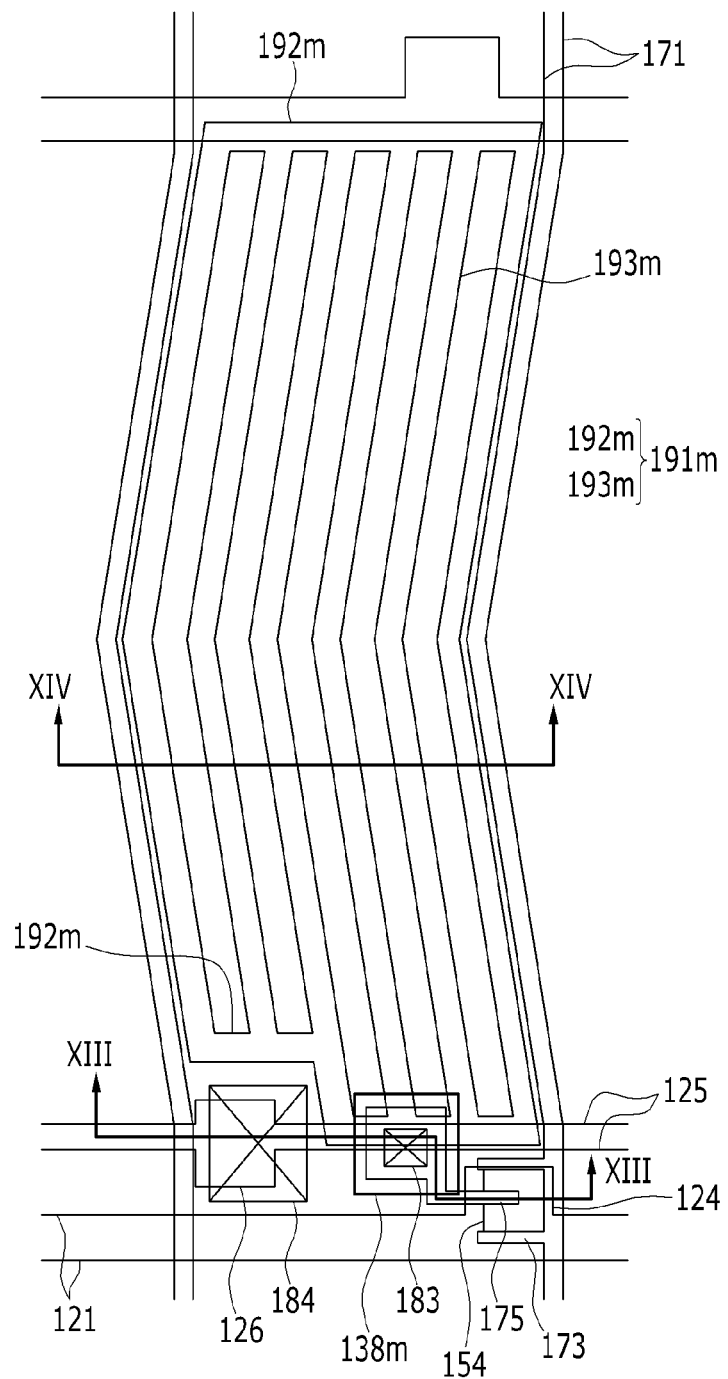
FIG. 12 is a layout view of one pixel of the liquid crystal display according to the exemplary embodiment of the present invention.
Figure 13:
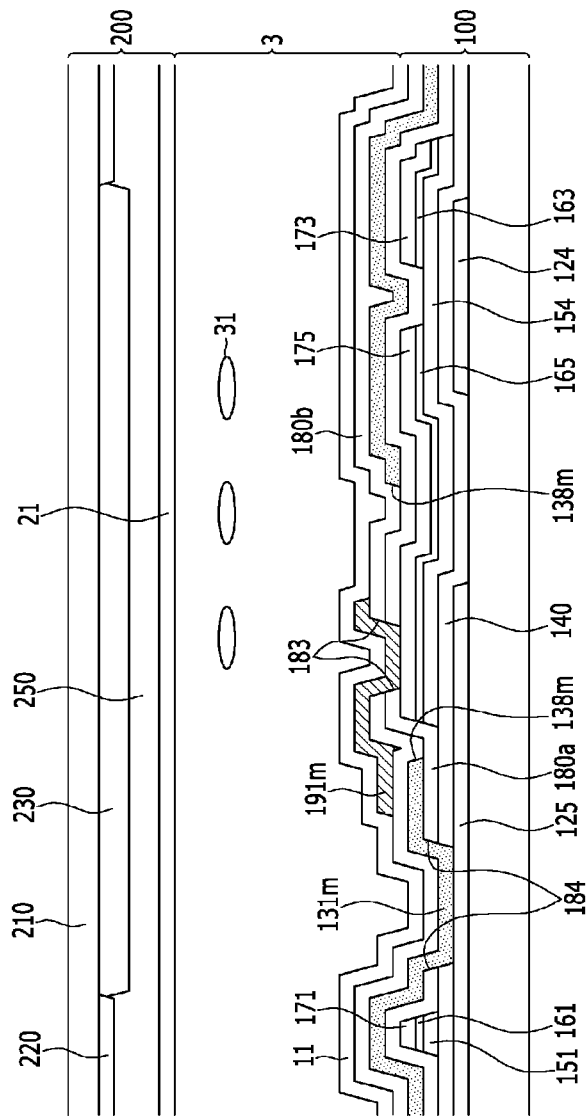
FIGS. 13 and 14 each are cross-sectional views taken along line XIII-XIII and line XIV-XIV of the liquid crystal display of FIG. 12.
Figure 14:
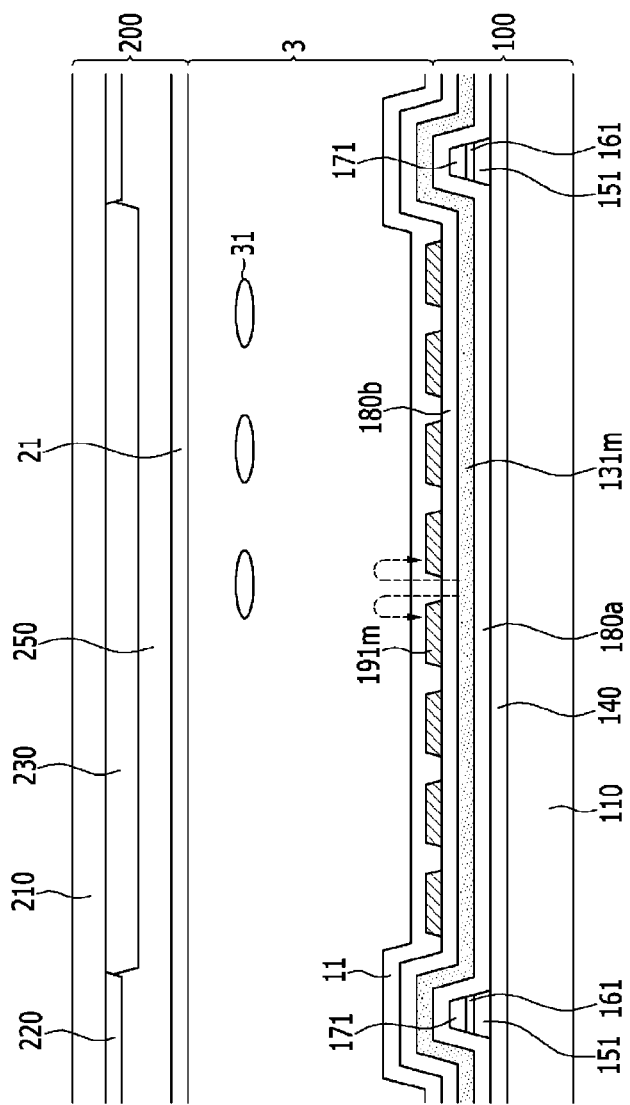

FIG. 12 is a layout view of one pixel of the liquid crystal display according to this embodiment of the present invention, and FIGS. 13 and 14 are cross-sectional views taken along line XIII-XIII and line XIV-XIV, respectively, of the liquid crystal display of FIG. 12.

The liquid crystal display according to the present exemplary embodiment of the present invention is similar to the exemplary embodiment shown in FIGS. 9 to 11, but contains differences in the structure of the data line 171, the pixel electrode 191, the common electrode 131, and the interlayer insulating layer lying therebetween.

Differences from the exemplary embodiments shown in FIGS. 9 to 11 will primarily be explained.

The data line 171 of this embodiment of the present invention is bent in each pixel area, to form a bevel angle with respect to the gate line 121.

The bevel angle of the data line 171 may be about 45 degrees or more.

The first passivation layer 180*a* is formed on the data conductors 171 and 175 and the exposed semiconductor protrusion 154, and the common electrode 131*m* is formed thereon.

The first passivation layer 180*a* and the gate insulating layer 140 include the contact hole 184 to expose at least a portion of the extension 126 of the common voltage line 125, and the common electrode 131*m* is electrically connected with the common voltage line 125 through the contact hole 184 to receive a predetermined voltage, such as the common voltage Vcom, from the common voltage line 125.

The common electrode 131*m* has a generally planar shape and is formed on substantially the entire surface of the substrate 110 over the plurality of pixels.

The second passivation layer 180*b* is formed on the common electrode 131*m*, and the pixel electrode 191*m* is formed thereon.

The first passivation layer 180*a* and the second passivation layer 180*b* are provided with the plurality of contact holes 183 to expose a portion of the drain electrode 175, and the pixel electrode 191*m* is electrically connected with the drain electrode 175 through the contact hole 183 so as to receive the data voltage.

The pixel electrode 191*m* includes the plurality of branch electrodes 193*m* spaced apart from each other while extending substantially parallel with each other, as well as the lower and upper horizontal parts 192*m* connecting the upper and lower ends of the branch electrode 193*m*.

The branch electrode 193*m* of the pixel electrode 191*m* may be bent along the data line 171, so that the branch electrode 193*m* have largely the same shape as the data line 171 (that is, the electrodes 193*m* remain parallel to the data lines 171 in their bent portions).

A data voltage and common voltage are applied to the pixel electrode 191*m* and common electrode 131*m* respectively, to generate an electric field in the liquid crystal layer 3.

In the present exemplary embodiment, the pixel electrode 191*m* is disposed on the common electrode 131*m*, and the common electrode 131*m* covers multiple data lines 171.

Therefore, similar to the above exemplary embodiment, it is possible to reduce crosstalk between the data line 171 and the pixel electrode 191, and to reduce light leakage due to a parasitic capacitance between the data line 171 and the adjacent pixel electrode 191.

In addition, the first passivation layer 180a (disposed between the data line 171 and the common electrode 131m) may be made of an organic insulating material or an inorganic insulating material, of which the dielectric constant may be about 3.5 or less. There may be about 10% deviation in such relative dielectric constant of the second passivation layer 180a, depending on the measuring method employed.

The dielectric constant of the first passivation layer 180a may be lower than the dielectric constant of either one or both of the gate insulating layer 140 and the second passivation layer 180b.

In the exemplary embodiment of the present invention, the thickness of the first passivation layer 180a may be in a range from about 0.5 μm to about 3.0 μm, and the thickness of the first passivation layer 180a may be generally proportional to its dielectric constant. That is, the lower the dielectric constant of the first passivation layer 180a is, the thinner its thickness may be.

As described above, the signal delay of the data line 171 may be reduced by lowering the dielectric constant of the first passivation layer 180a.

An additional passivation layer (not shown) extending along the data line 171 and covering the data line 171 may be further formed on the first passivation layer 180a. The additional passivation layer may further include a portion covering the area between two data lines 171.

In this case, the passivation layer (not shown) covering the data line 171 may have a dielectric constant of about 3.5 or less. There may be about 10% deviation in such relative dielectric constant of the passivation layer, depending on the measuring method used.

In addition, various characteristics and effects of the third passivation layer 180d of the exemplary embodiment shown in FIGS. 9 to 11 described above may be applied to the first passivation layer 180a of the exemplary embodiment of the present invention.

Hereinafter, a method of manufacturing a lower display panel of the liquid crystal display of the present invention will be described.

A method of manufacturing a lower display panel 100 of the liquid crystal display shown in FIGS. 1 to 5 will be described with reference to FIGS. 15 to 30.

FIGS. 15, 18, 21 and 24 are layout views sequentially showing the liquid crystal display of FIGS. 1 to 5 at an intermediate step in its manufacture. FIGS. 16, 19, 22, 25, 27, and 29 are sequential cross-sectional views taken along line XVI-XVI, line XIX-XIX, line XXII-XXII, and line XXV-XXV of the liquid crystal display of FIGS. 15, 18, 21, and 24, and FIGS. 17, 20, 23, 26, 28, and 30 are sequential cross-sectional views taken along line XVII-XVII, line XX-XX, line XXIII-XXIII, and line XXVI-XXVI of the liquid crystal display of FIGS. 15, 18, 21, and 24.

Figure 15:
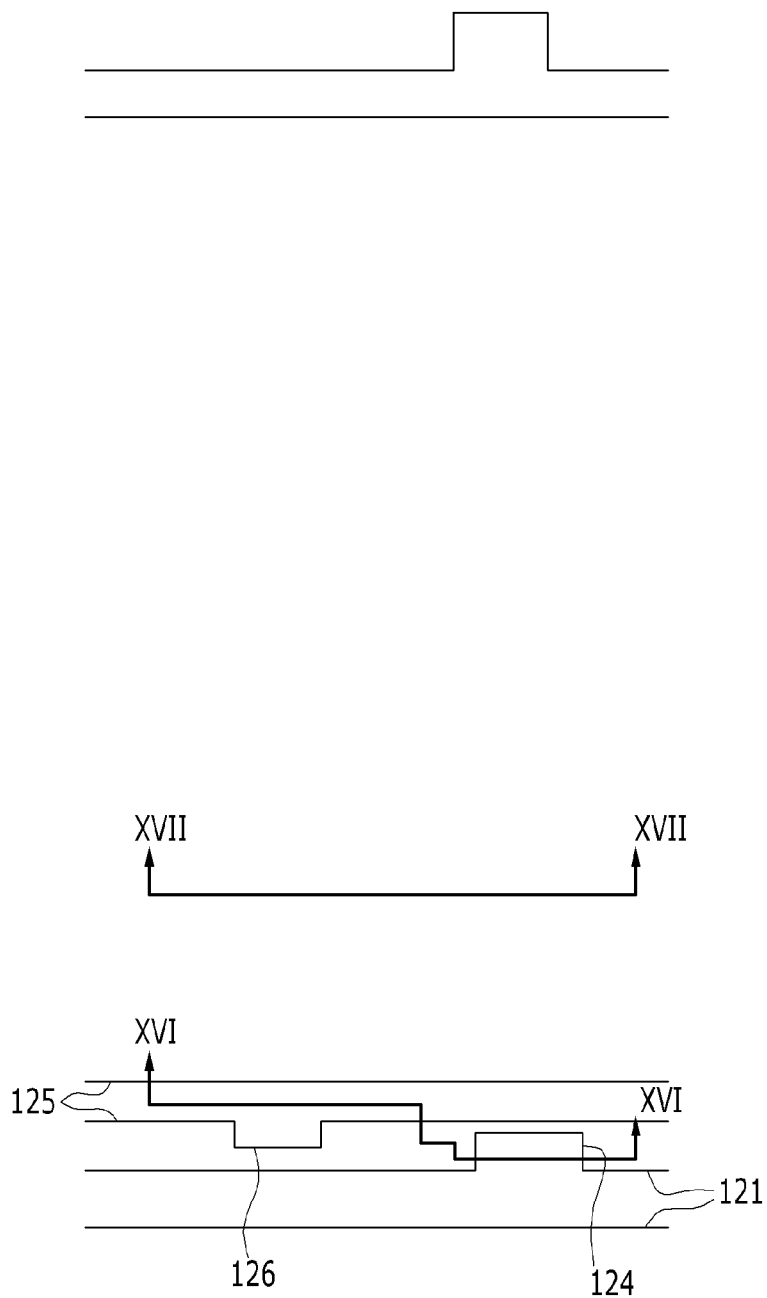
FIGS. 15, 18, 21 and 24 are layout views sequentially showing the liquid crystal display at the intermediate step of a manufacturing method of the liquid crystal display shown in FIGS. 1 to 5 according to an exemplary embodiment of the present invention.
Figure 16:
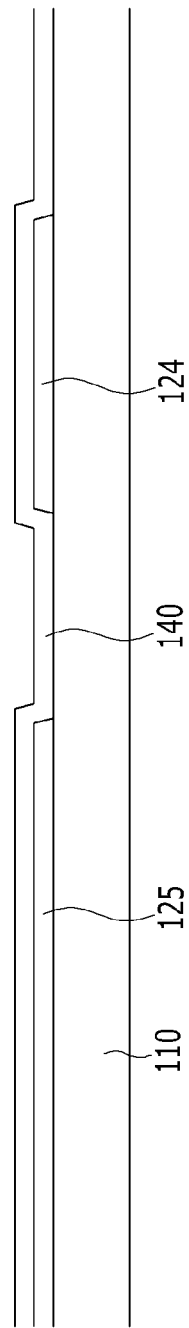
FIGS. 16, 19, 22, 25, 27, and 29 are sequential cross-sectional views taken along line XVI-XVI, line XIX-XIX, line XXII-XXII, and line XXV-XXV of the liquid crystal display of FIGS. 15, 18, 21, and 24.
Figure 17:
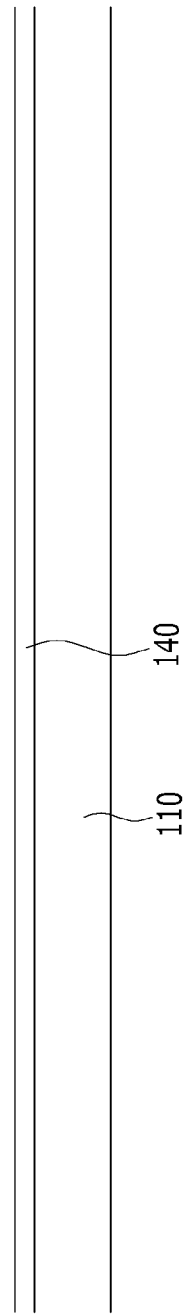
FIGS. 17, 20, 23, 26, 28, and 30 are sequential cross-sectional views taken along line XVII-XVII, line XX-XX, line XXIII-XXIII, and line XXVI-XXVI of the liquid crystal display of FIGS. 15, 18, 21, and 24.

First, referring to FIGS. 15, 16, and 17, the plurality of gate conductors 121 and 125 (including the plurality of gate lines 121 having the gate electrodes 124 and the plurality of common voltage lines 125 having the extension 126) are formed on the insulating substrate 110, and the gate insulating layer 140 is stacked thereon.

Figure 18:
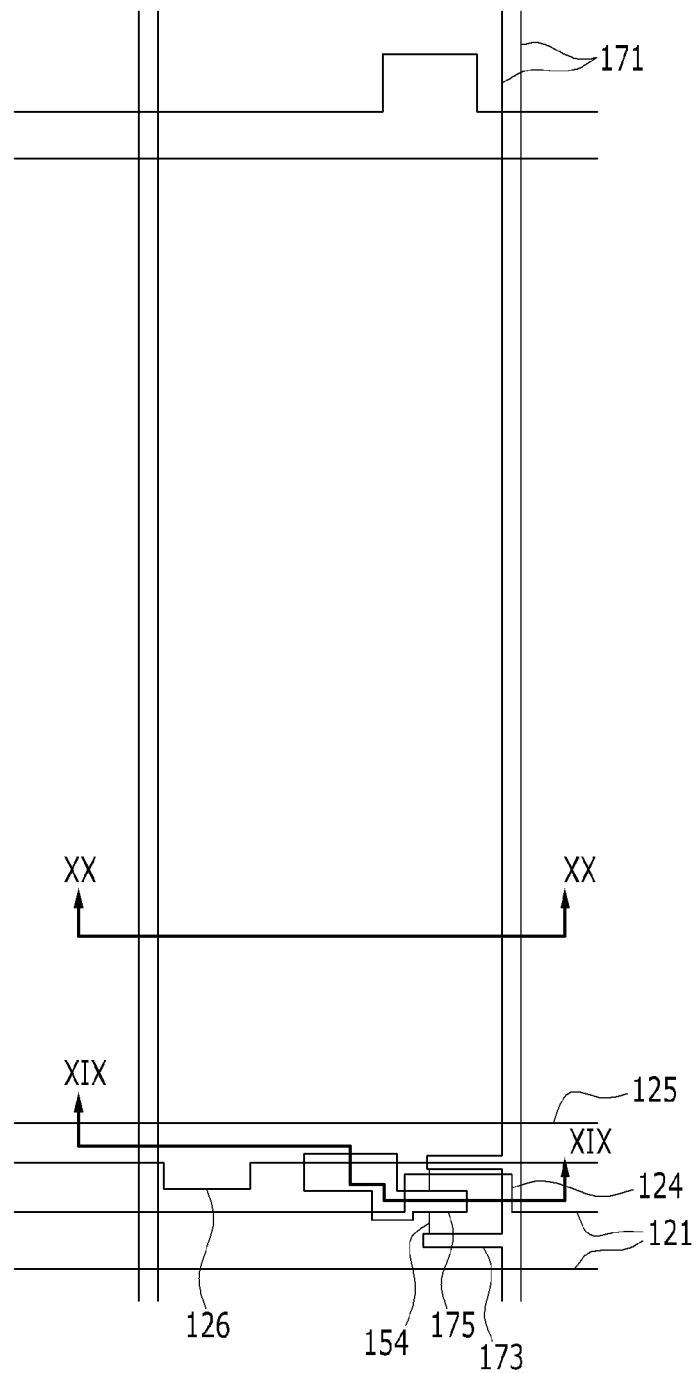
Figure 19:
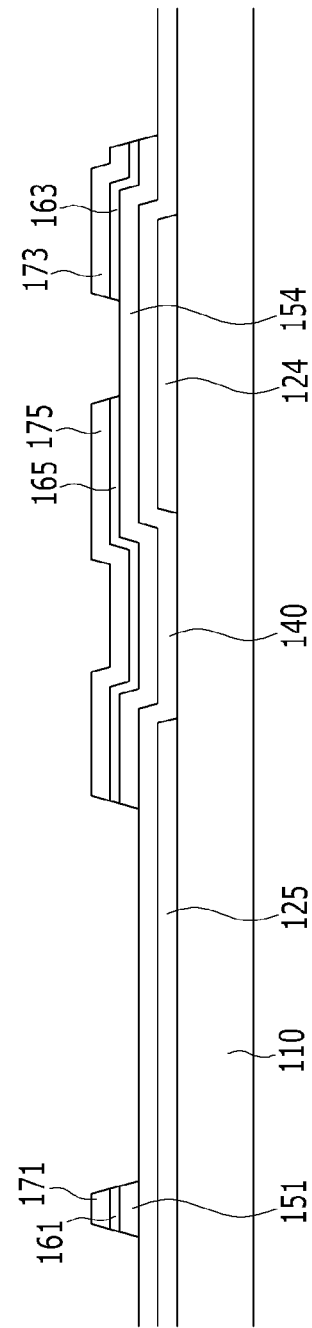
Figure 20:
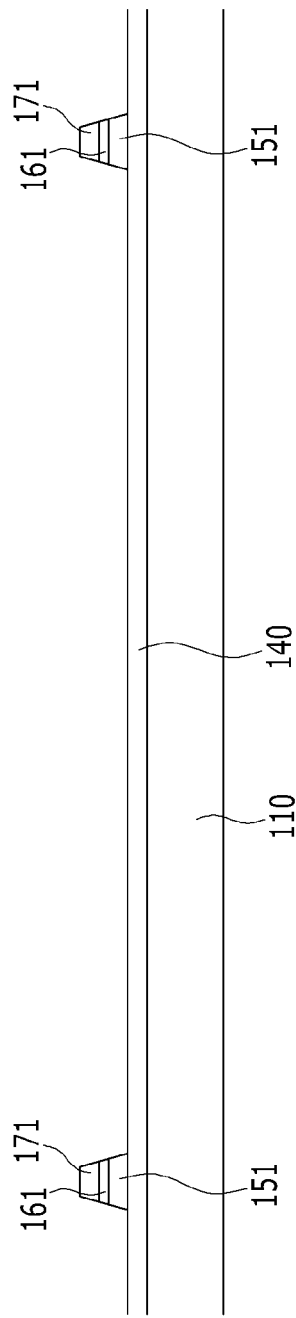

Next, referring to FIGS. 18, 19, and 20, a semiconductor layer (not shown), a semiconductor layer (not shown) doped with one or more impurities, and a data conductive layer (not shown) are sequentially stacked on the gate insulating layer 140. Then, the plurality of linear semiconductors 151 (including the semiconductor protrusion 154, the plurality of ohmic contacts 161 and 165, and the plurality of data conductors which includes the plurality of data lines 171 having the source electrode 173, and the plurality of drain electrodes 175) are formed by exposure and etching through a single mask.

Figure 21:
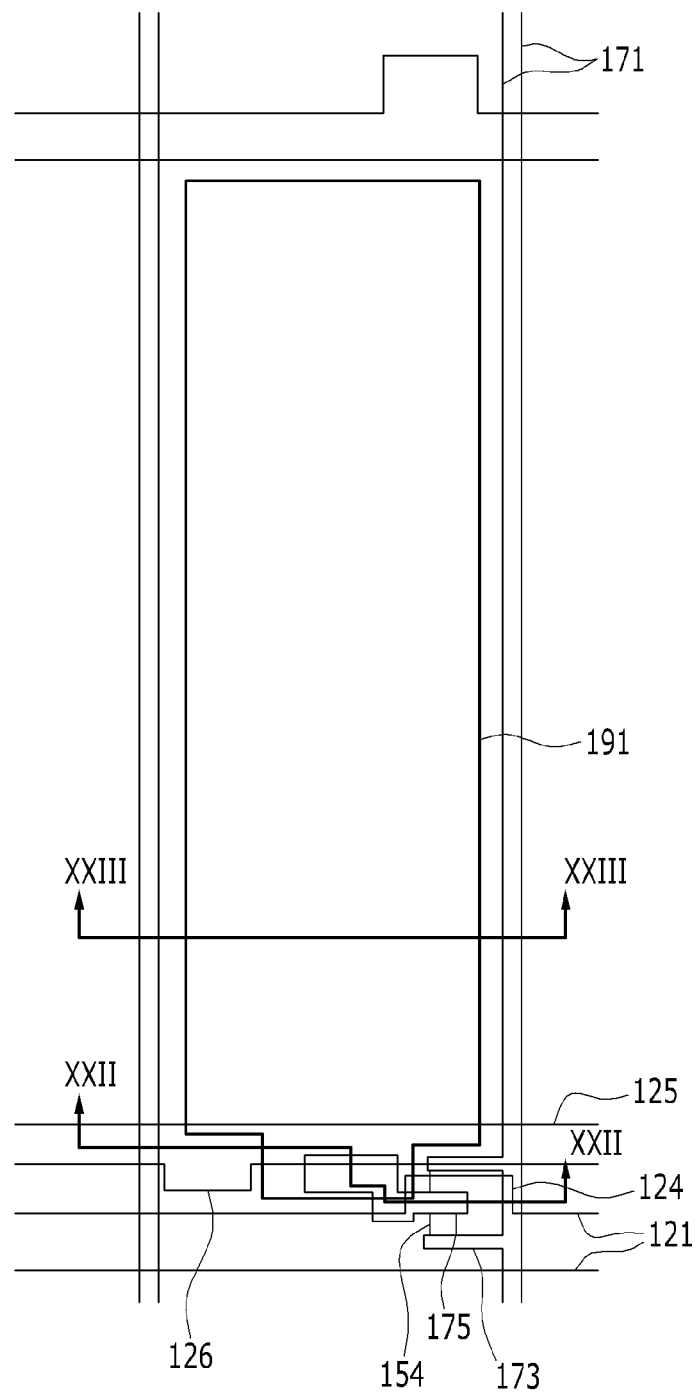
Figure 22:
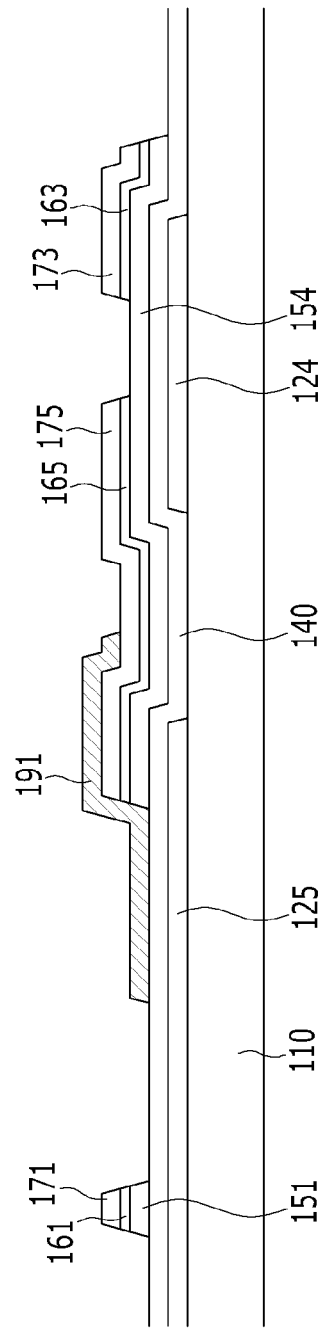
Figure 23:
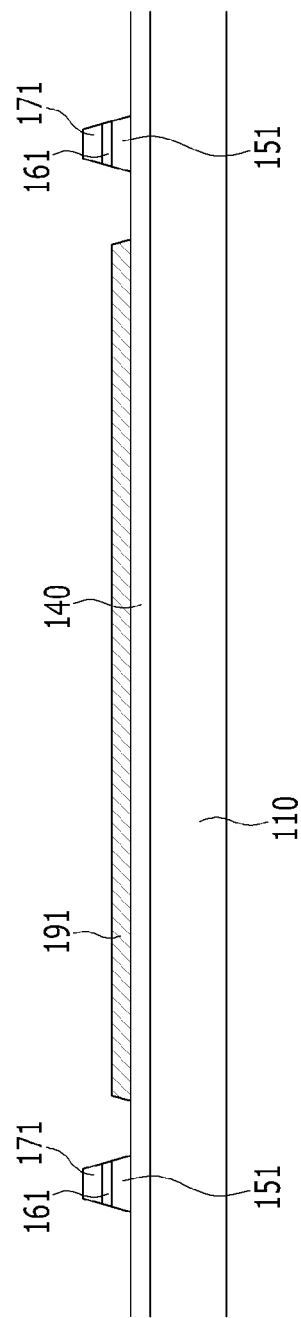

Next, referring to FIGS. 21, 22, and 23, a transparent conductive material such as ITO, IZO, or the like is stacked on the data conductor and is etched, thereby forming the plurality of surface-type pixel electrodes 191.

Figure 24:
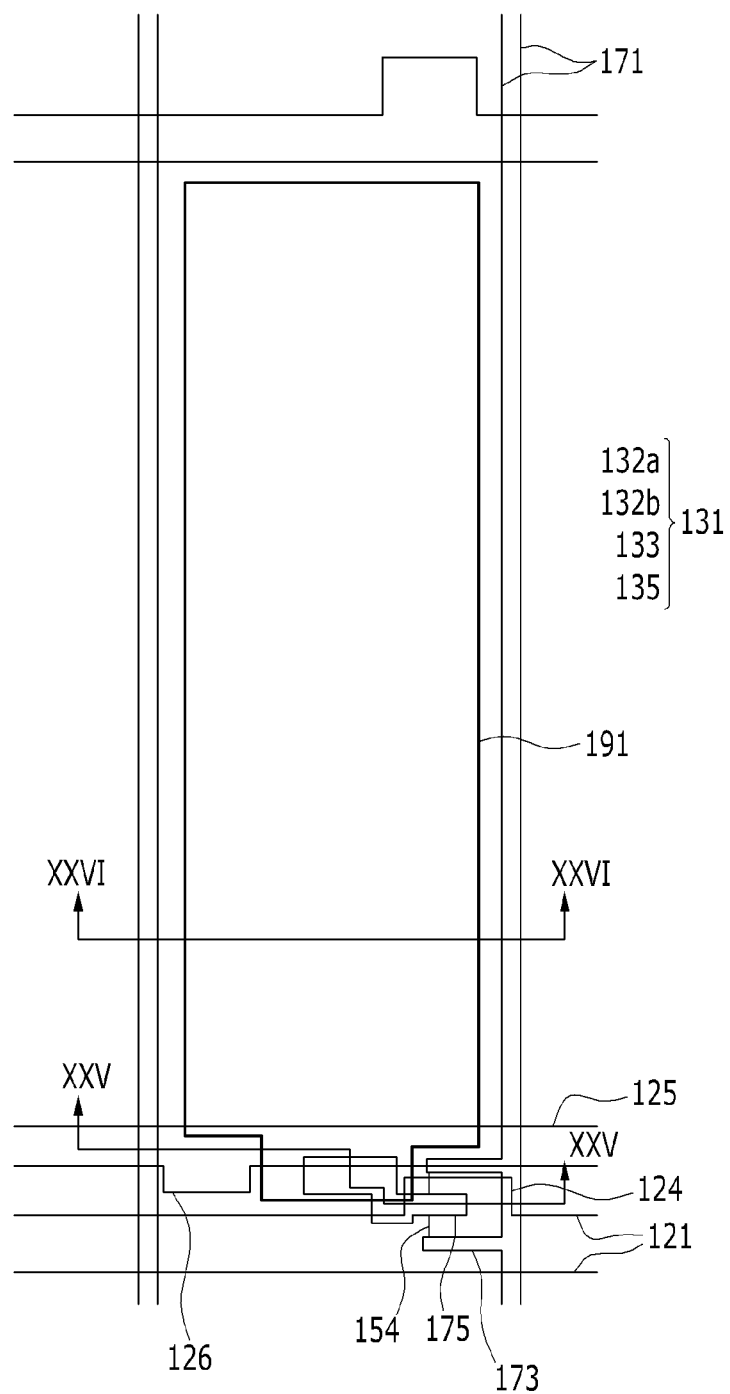
Figure 25:
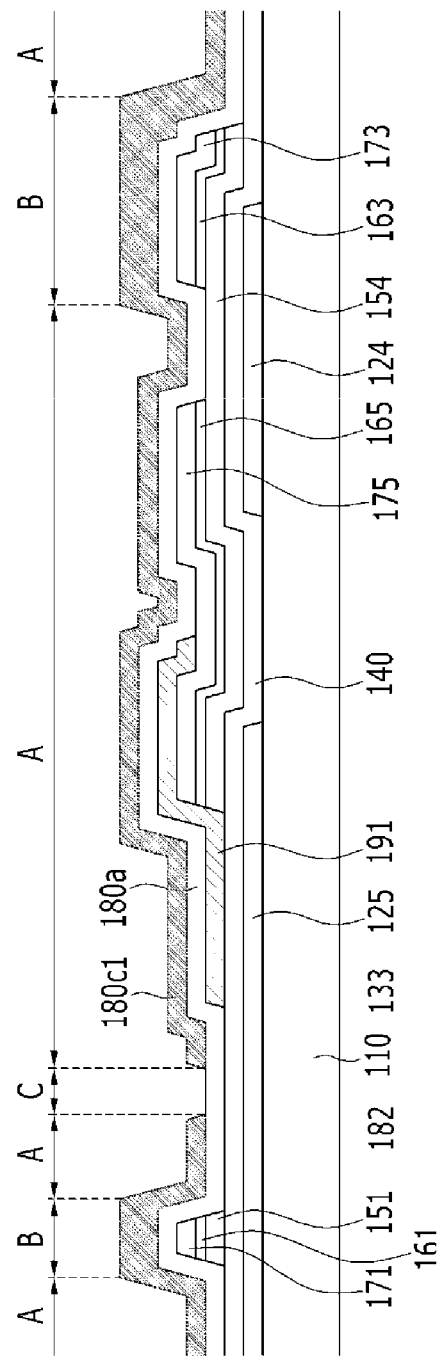
Figure 26:
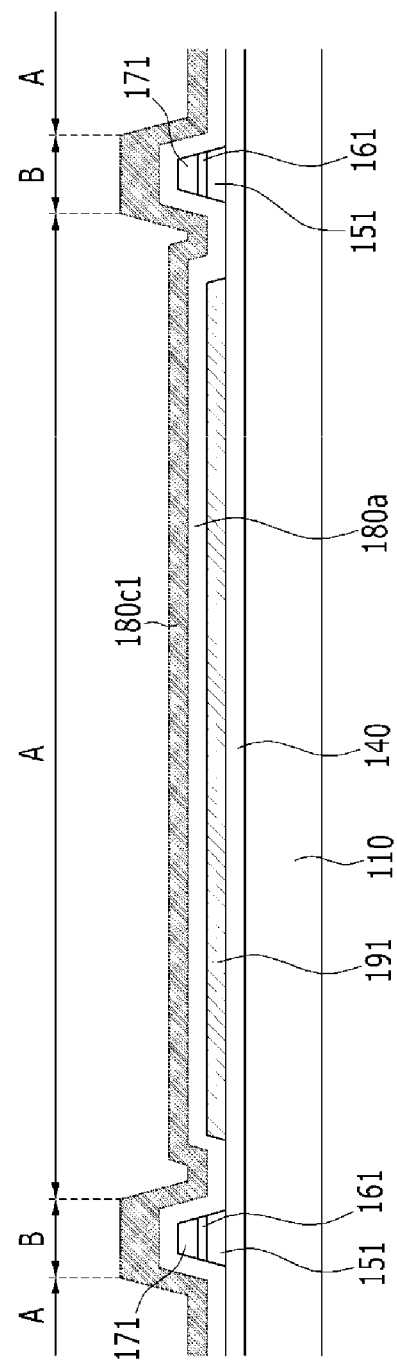

Next, referring to FIGS. 24, 25, and 26, the first passivation layer 180a, which can be made of an organic insulating material or an inorganic insulating material, is stacked on the pixel electrode 191.

Then, organic material with a dielectric constant of about 3.5 or less is stacked on the first passivation layer 180a and a second passivation pattern 180c1 formed of an organic layer is formed by exposure and developing.

The second passivation pattern 180c1 includes a thicker portion disposed on the upper portion of the data line 171, and a thinner portion having a lesser thickness than the thick portion.

As described above, as a method of making the thickness of the second passivation pattern 180c1 vary by position, a method of using a photo mask with a translucent area may be employed.

When the second passivation pattern 180c1 has negative photosensitivity (i.e. is more easily removed in portions where light is not irradiated), the area A of the photo mask is translucent to transmit a portion of light, the area B is transparent to transmit light, and the area C is opaque to block light.

Therefore, among the second passivation pattern 180c1, the portion corresponding to area A of the photo mask is formed to have a lower thickness, a portion corresponding to area B is formed to have a higher thickness, and a portion corresponding to area C is removed.

The photo mask of the area A may include a pattern such as slits or lattice, or a translucent layer, in order to control the amount of light transmitted.

If the second passivation pattern 180c1 has positive photosensitivity, the transparency of the areas B and C of the photo mask is reversed.

Figure 27:
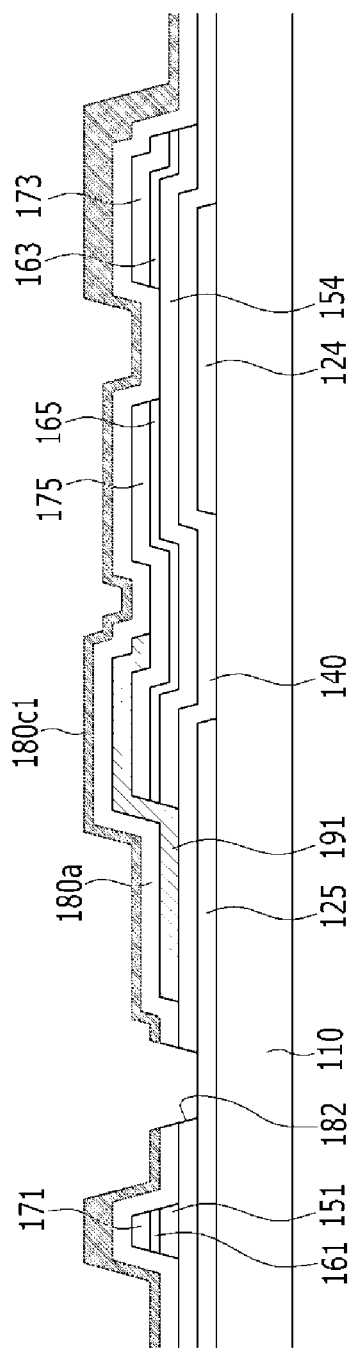
Figure 28:
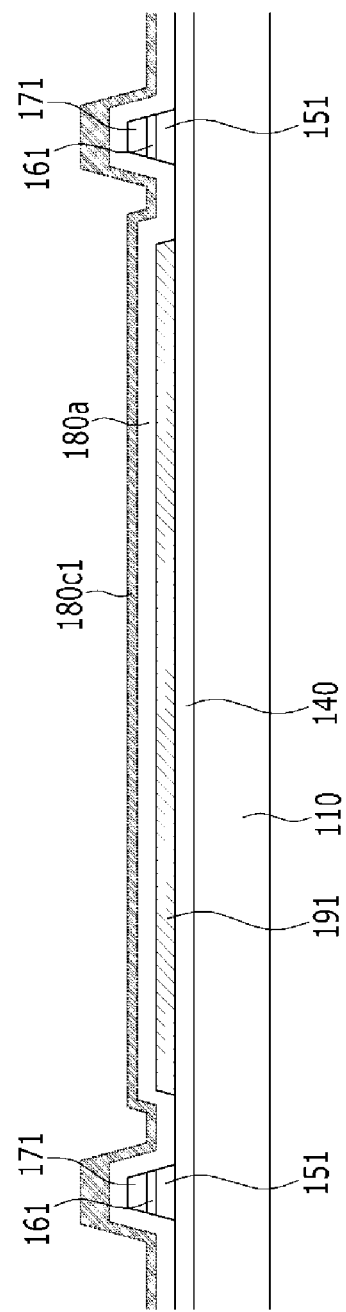

Next, referring to FIGS. 27 and 28, the gate insulating layer 140 and the first passivation layer 180a are subjected to dry etching using the second passivation pattern 180c1 as a mask, thereby forming the contact hole 182 to expose a portion of the common voltage line 125.

In this case, the thickness of the second passivation pattern 180c1 over the entire substrate 110 may be made thinner as compared to the previous thickness of the second passivation pattern 180c1 in the steps shown in FIGS. 25 and 26.

Then, a transparent conductive material such as ITO, IZO, etc., is stacked on the second passivation pattern 180c1 and is etched, thereby making it possible to form the plurality of common electrodes 131.

In this case, the second passivation pattern 180c1 may be a second passivation layer 180b shown in FIGS. 1, 4, and 5 described above, and the lower display panel 100 of the liquid crystal display shown in FIGS. 1, 4, and 5 may be manufactured by the above-mentioned manufacturing method.

Figure 29:
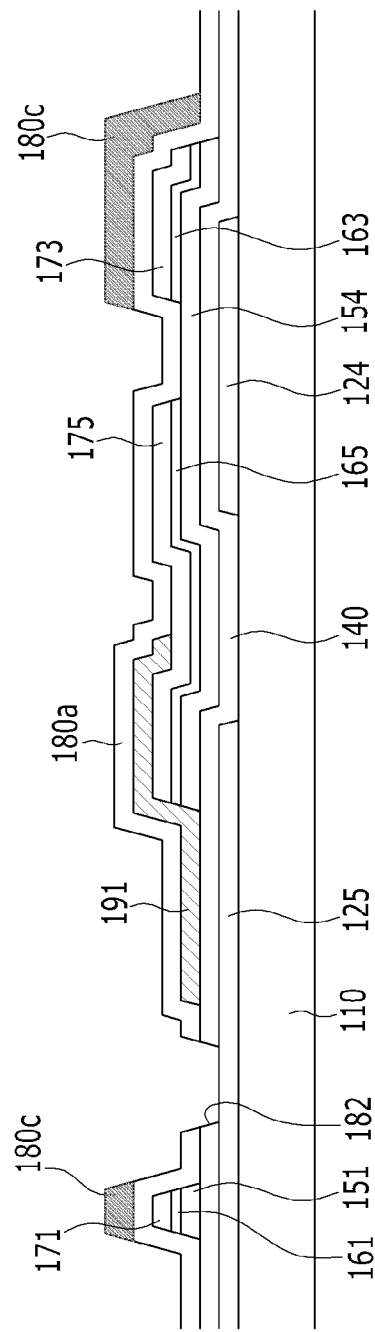
Figure 30:
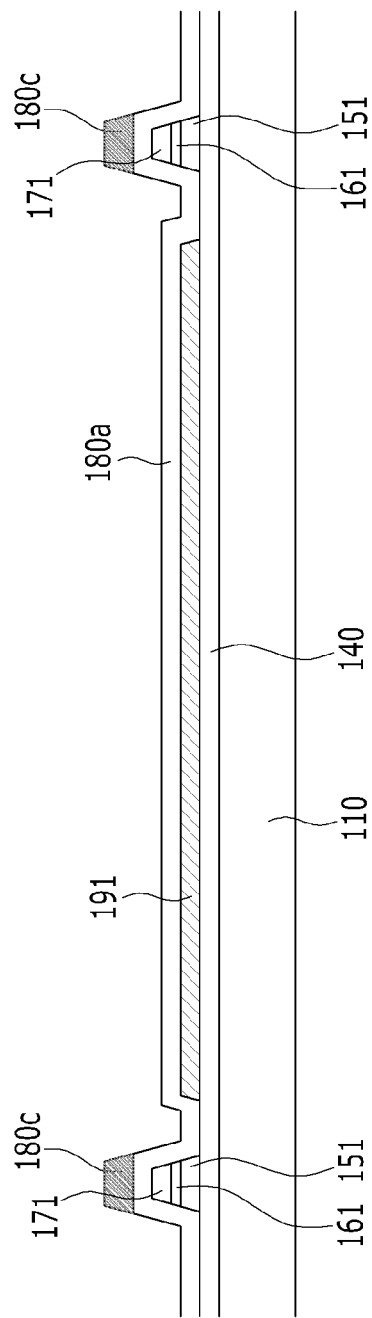

Meanwhile, further referring to FIGS. 29 and 30, at the steps of FIGS. 27 and 28, only the thicker portion of layer 180c1 that is substantially disposed on the data line 171 remains, with the remaining thin portion having been removed by ashing the second passivation pattern 180c1 entirely, thereby forming the second passivation layer 180c, which corresponds to FIGS. 1, 2 and 3 explained above.

Finally, referring to FIGS. 1 to 3, a transparent conductive material such as ITO, IZO, etc., is stacked on the second passivation layer 180c and is etched, thereby forming the plurality of common electrodes 131.

The lower display panel 100 of the liquid crystal display shown in FIGS. 1, 2, and 3 may be manufactured by the above-mentioned manufacturing method.

In the exemplary embodiment of the present invention described above, the branch electrodes of the common electrode or the pixel electrode are substantially inclined at an angle that is closer to the vertical direction (i.e. the extending direction of the data line) than the horizontal, but embodiments of the invention are not limited thereto. Instead, the branch electrodes of the common electrode or the pixel electrode may be inclined closer to the horizontal direction (i.e., the extending direction of the gate line).

Figure 31:
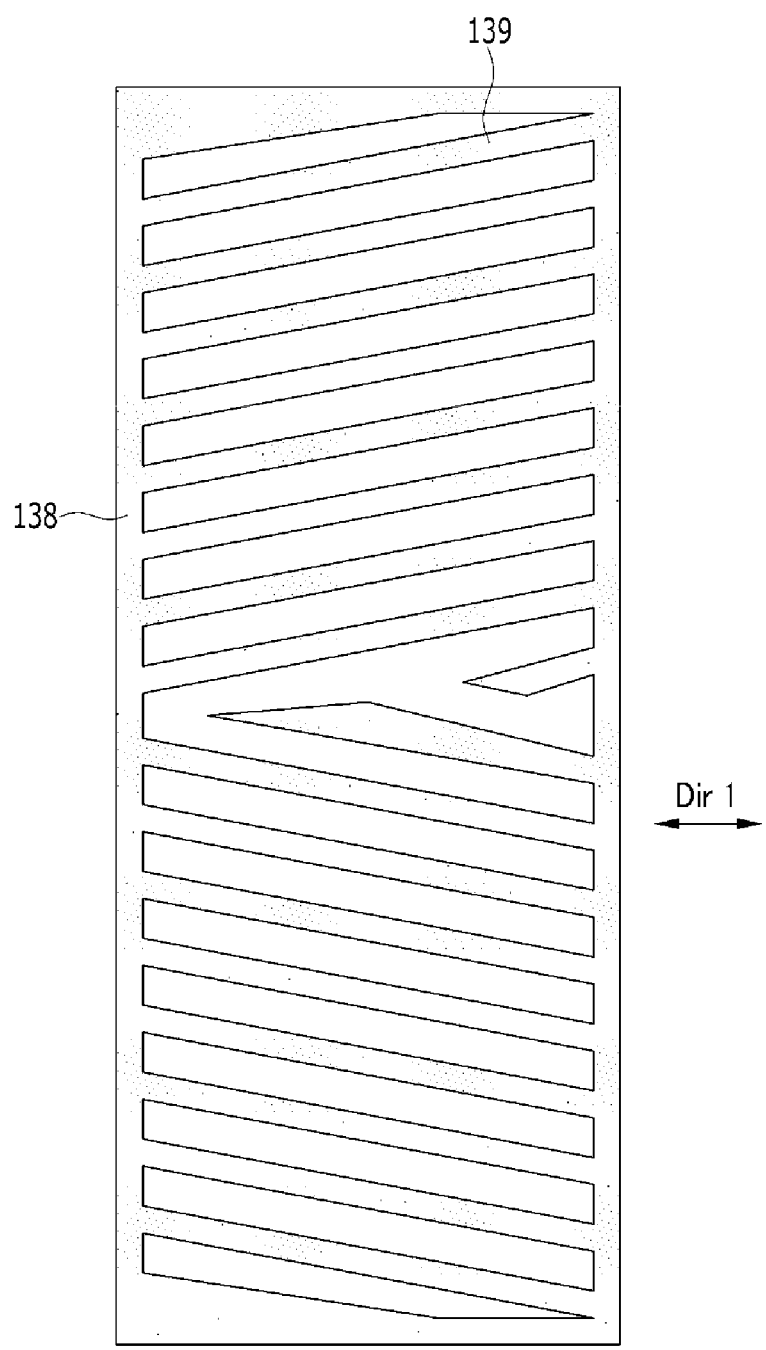
FIG. 31 is a plan view of a pixel electrode or a common electrode according to another exemplary embodiment of the present invention.

For example, as shown in FIG. 31, the common electrode or the pixel electrode according to another exemplary embodiment of the present invention may include at least one vertical stem part 138 that extends in the vertical direction, and a plurality of branch electrodes 139 connected thereto.

The plurality of branch electrodes 139 may form an angle larger than about 0 degree or smaller than about 45 degrees with respect to a horizontal direction Dir1, wherein the horizontal direction Dir1 may be the direction in which the gate line 121 generally extend, in the above-mentioned exemplary embodiments.

Next, a liquid crystal display according to an exemplary embodiment of the present invention will be described with reference to FIGS. 32, 33, and 34. The same components as the above-mentioned exemplary embodiments, in particular the exemplary embodiments shown in FIGS. 1 to 5, are denoted by the same reference numerals. Accordingly, substantive description thereof will be omitted.

Figure 32:
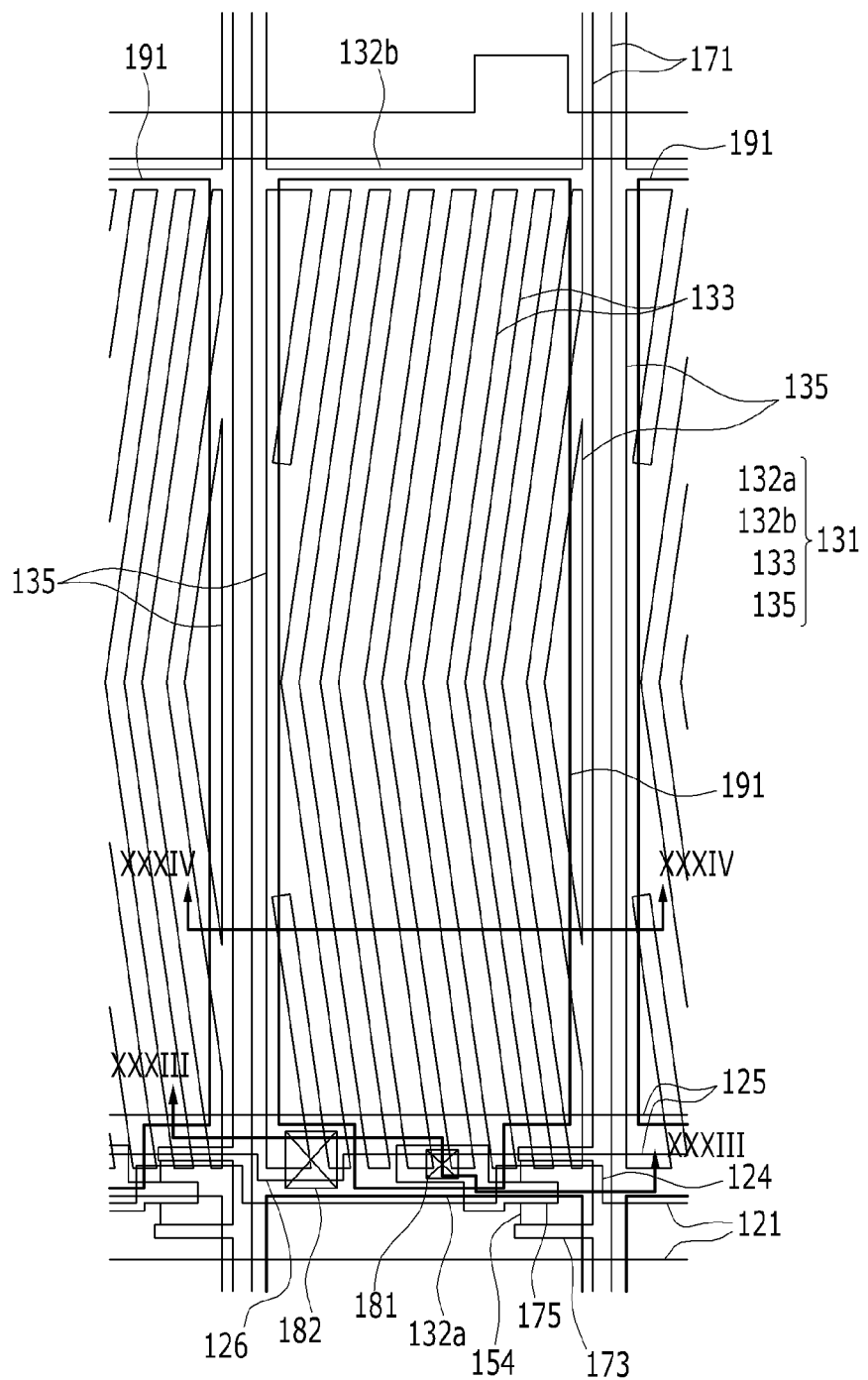
FIG. 32 is a layout view of one pixel of a liquid crystal display according to an exemplary embodiment of the present invention.
Figure 33:
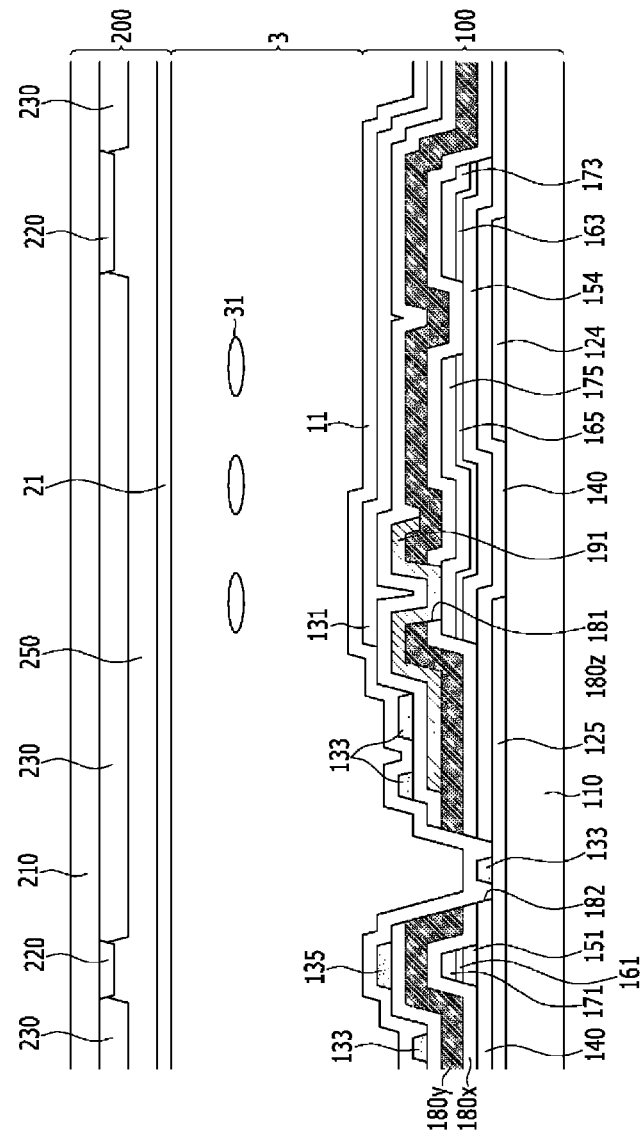
FIGS. 33 and 34 each are cross-sectional views taken along line XXXIII-XXXIII and line XXXIV-XXXIV of the liquid crystal display of FIG. 32, according to the exemplary embodiment of the present invention.
Figure 34:
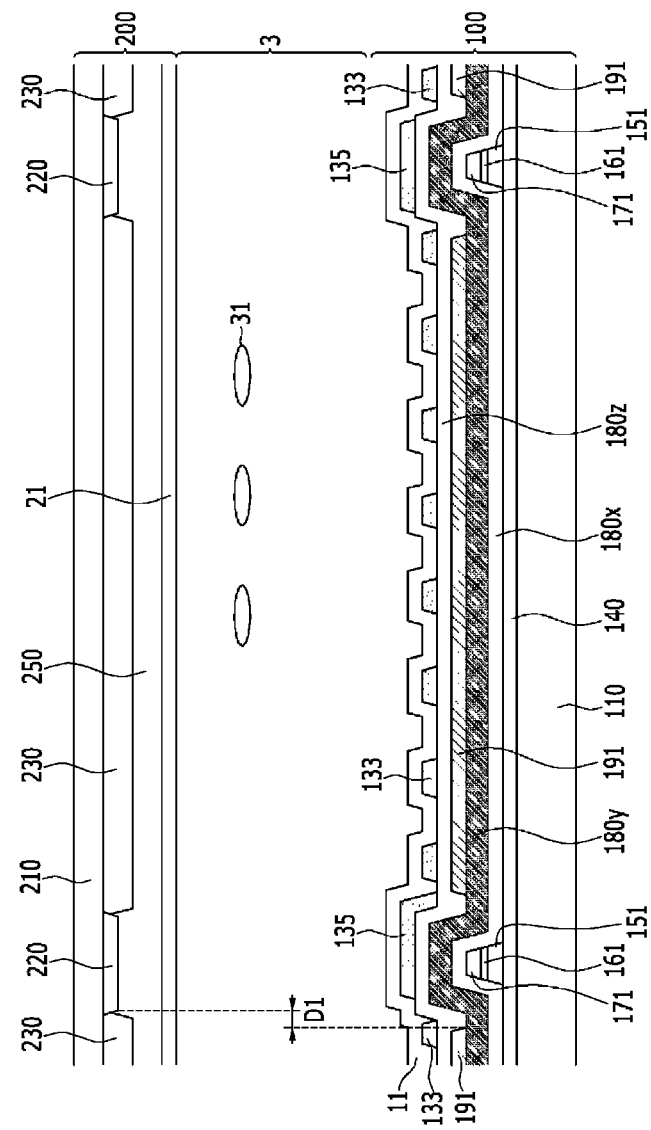

FIG. 32 is a layout view of one pixel of a liquid crystal display according to an exemplary embodiment of the present invention and FIGS. 33 and 34 each are cross-sectional views taken along line XXXIII-XXXIII and line XXXIV-XXXIV of FIG. 32 respectively, according to the exemplary embodiment of the present invention.

A liquid crystal display according an exemplary embodiment of the present invention includes a lower display panel 100 and an upper display panel 200 that face each other, with a liquid crystal layer 3 disposed between the two display panels 100 and 200.

First, describing the lower display panel 100, a plurality of gate conductors, including a plurality of gate lines 121 and a plurality of common voltage lines 125, are formed on an insulating substrate 110. A gate insulating layer 140 is then formed on the gate conductors 121 and 125. A plurality of linear semiconductors 151 are formed on the gate insulating layer 140, and a plurality of linear ohmic contacts 161 and a plurality of island ohmic contacts 165 are formed on the linear semiconductors 151. Data conductors, including a plurality of data lines 171 and a plurality of drain electrodes 175, are formed on the ohmic contacts 161 and 165.

A first passivation layer 180x is disposed on the data conductors 171 and 175 and the exposed semiconductor protrusion 154 of the linear semiconductors 151, wherein the first passivation layer 180x may be made of an organic insulating material, an inorganic insulating material, or the like.

A second passivation layer 180y is disposed on the first passivation layer 180x. The second passivation layer 180y includes an organic material and may be formed on substantially the entire surface of the substrate 110 while covering the data line 171.

The relative permittivity of the second passivation layer 180y may be 3.5 or less. There may be about 10% deviation in such relative dielectric constant of the second passivation layer 180y, according to the measuring method employed. When the second passivation layer 180y includes a colored material such as a material for color filters, the relative dielectric constant of the second passivation layer 180y may be increased to about 4.5, accounting for the relative dielectric constant of the pigment or dye included in the colored material. A thickness of the second passivation layer 180y may be in a range from about 0.5 μm to about 3.0 μm. The lower the relative permittivity of the second passivation layer 180y is, the thinner the thickness of the second passivation layer 180y may become. In the present exemplary embodiment, the upper surface of the second passivation layer 180y may be approximately flat.

The first passivation layer 180x and the second passivation layer 180y have a contact hole 181 formed therethrough, which exposes a portion of the drain electrode 175.

A plurality of pixel electrodes 191 are disposed on the second passivation layer 180y. The pixel electrode may have an approximately planar shape to fill most of the area surrounded by the gate lines 121 and the data lines 171. The outer shape of the pixel electrode 191 may be a polygon having sides approximately parallel with the gate lines 121 or the data lines 171, and with both lower corners of the pixel electrode 191 being chamfered. However, the shape of the pixel electrode 191 is not limited thereto.

In operation, a data voltage is applied to the pixel electrode 191 from the drain electrode 175 through the contact hole 181.

A third passivation layer 180z is disposed on the pixel electrode 191. The third passivation layer 180z may be made of an inorganic insulating material, an organic insulating material, or the like. The third passivation layer 180z, the second passivation layer 180y, the first passivation layer 180x, and the gate insulating layer 140 have in common a plurality of contact holes 182 that each expose a portion of the common voltage line 125 (for example, a portion of the extension 126).

A plurality of common electrodes 131 are disposed on the third passivation layer 180z. Each common electrode 131 includes a pair of vertical parts 135 that cover the data lines 171, a plurality of branch electrodes 133 that are disposed between the two vertical parts 135 and that are spaced apart from each other, and both a lower horizontal part 132a and an upper horizontal part 132b connecting the end portions of the plurality of branch electrodes 133. The vertical part 135 is approximately parallel to the data line 171 and overlaps (i.e. at least partially covers) the data line 171. The adjacent common electrodes 131 are connected to each other while sharing a single horizontal part 135.

Next, describing the upper display panel 200, a light blocking member 220 and a color filter 230 are disposed on the insulating substrate 210.

The light blocking member 220 includes a portion covering the area between two adjacent pixel electrodes 191, generally over the data line 171. Therefore, the light blocking member 220 may cover the portion of the data line 171 extending between two adjacent pixel electrodes 191. The width of the light blocking member 220 covering the area between two adjacent pixel electrodes 191 may be equal to or smaller than a distance between the two adjacent pixel electrodes 191. For example, a distance D1 between an edge of the light blocking member 220 and an edge of the adjacent pixel electrode 191 may be 0 or more, and may be smaller than a distance between the two adjacent pixel electrodes 191. The light blocking member 220 prevents light from being leaked between the adjacent pixel electrodes 191, and defines opening areas facing the pixel electrode 191.

An overcoat 250 may be further disposed on the light blocking member 220 and the color filter 230.

Unlike the exemplary embodiment, at least one of the light blocking member 220 and the color filter 230 may be disposed on the lower display panel 100.

The outside of the substrate 110 of the lower display panel 100 may be further provided with a backlight unit (not shown) that generates light and provides the light to the two display panels 100 and 200.

In the exemplary embodiment, the second passivation layer 180y formed of an organic layer is interposed between the data line 171 and the overlapping vertical part 135 of the upper common electrode 131. Thus, the parasitic capacitance of the data line 171 and the common electrode 131 may be decreased, thereby making it possible to reduce the signal delay of the data line 171.

Figure 35:
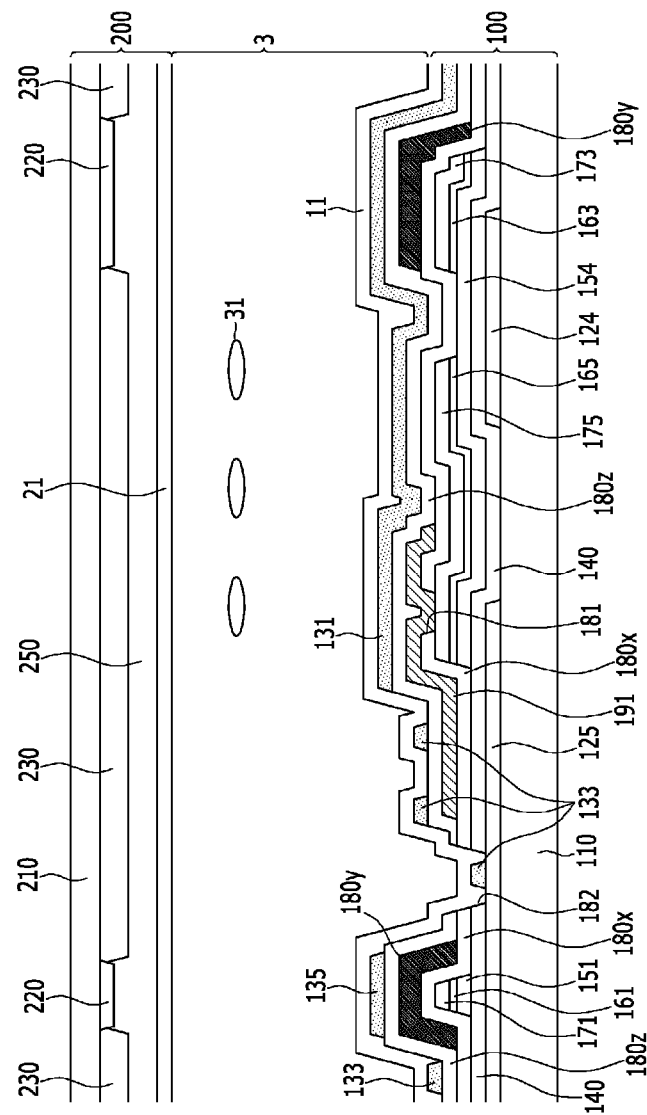
FIGS. 35 and 36 each are cross-sectional views taken along line XXXIII-XXXIII and line XXXIV-XXXIV of the liquid crystal display of FIG. 32, according to another exemplary embodiment of the present invention.
Figure 36:
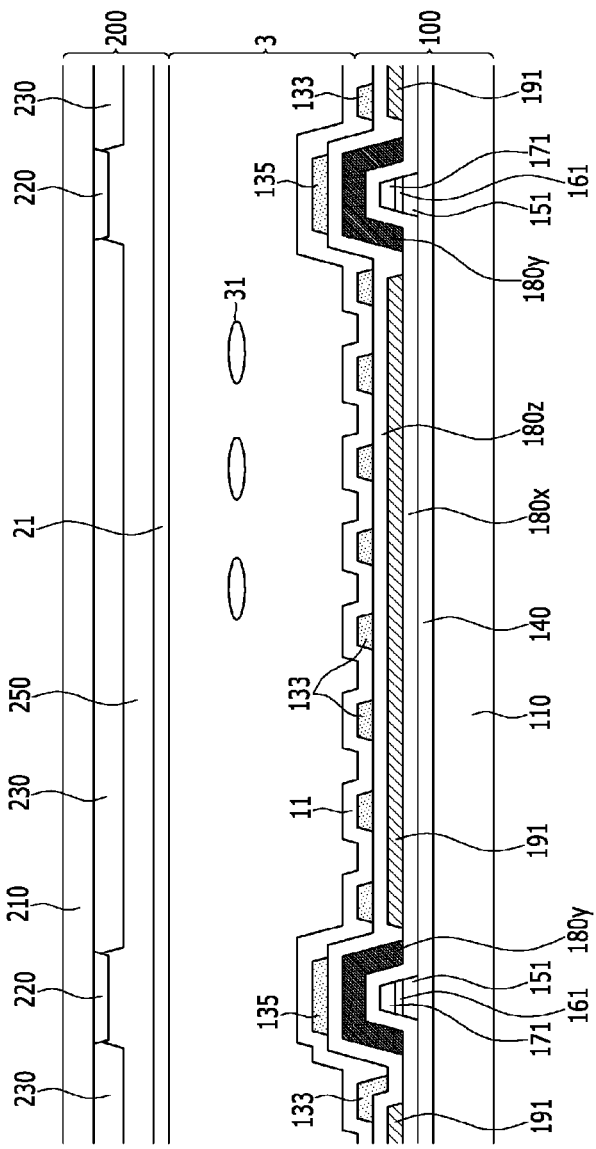

FIGS. 35 and 36 each are cross-sectional views taken along line XXXIII-XXXIII and line XXXIV-XXXIV of FIG. 32 respectively, according to another exemplary embodiment of the present invention.

The liquid crystal display according to the exemplary embodiment shown in FIGS. 32, 35, and 36 is approximately the same as the exemplary embodiment shown in FIGS. 32, 33, and 34 as described above, except for the structure of the second passivation layer 180y. For example, as shown in FIGS. 35 and 36, the second passivation layer 180y is not formed on substantially the entire surface of substrate 110, but extends along the data line 171 while covering the data line 171. In this case, the contact holes 181 or the contact hole 182 as described above may not be formed in the second passivation layer 180y. As in the present embodiment, the parasitic capacitance of the data line 171 and the common electrode 131 may be lowered by forming the second passivation layer 180y only on the data line 171, thereby making it possible to reduce the signal delay of the data line 171.

As in the exemplary embodiment of the present invention, the second passivation layer 180y is formed only on the data line 171 and is not formed in a display area (for example, a pixel area, or an area where the pixel electrode 191 is formed between the two data lines 171), such that absorption of light from the backlight due to the organic second passivation layer 180y may be reduced, thereby making it possible to prevent a reduction in transmittance.

The layer position of the first passivation layer 180x and the second passivation layer 180y may be switched. That is, layer 180x may instead be formed on layer 180y.

Figure 37:
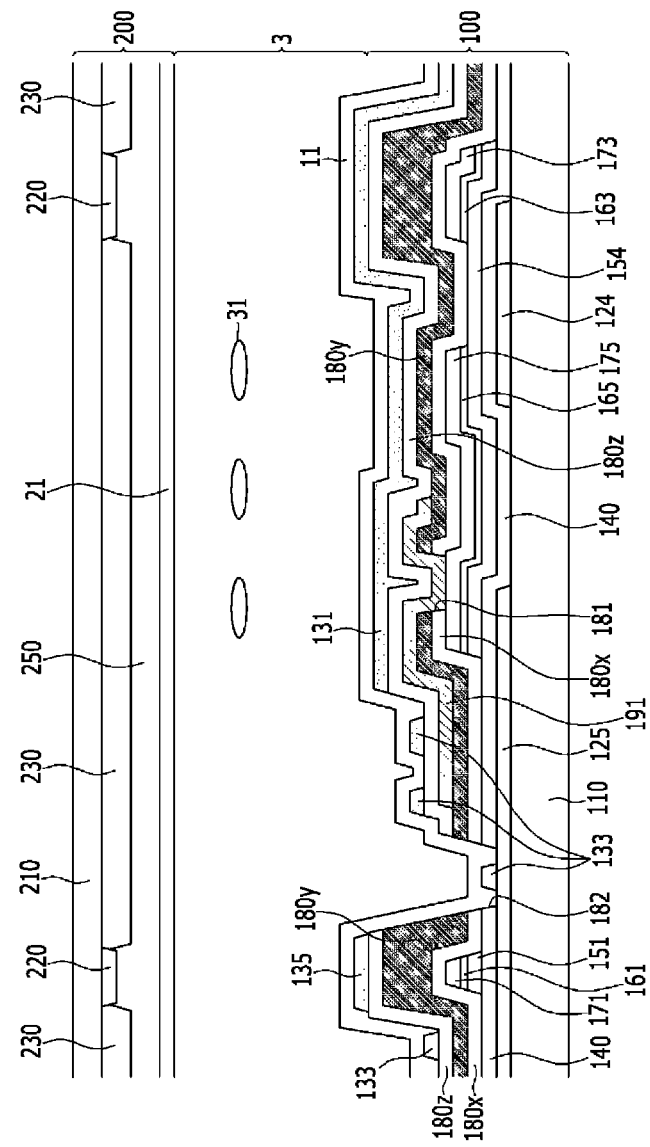
FIGS. 37 and 38 each are cross-sectional views taken along line XXXIII-XXXIII and line XXXIV-XXXIV of the liquid crystal display of FIG. 32, according to another exemplary embodiment of the present invention.
Figure 38:
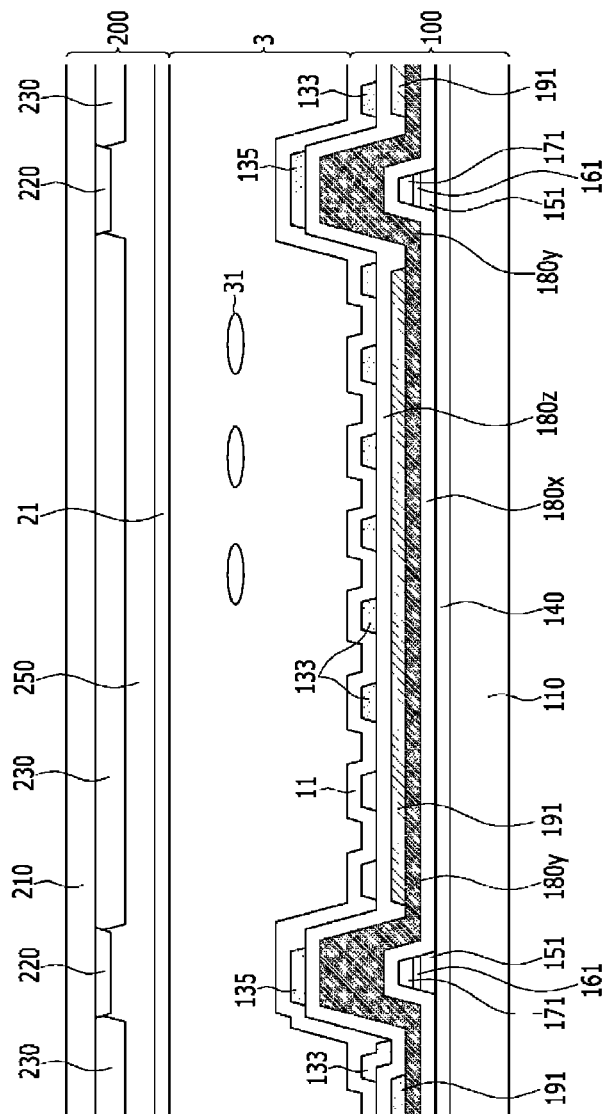

FIGS. 37 and 38 each are cross-sectional views taken along line XXXIII-XXXIII and line XXXIV-XXXIV of FIG. 32 respectively, according to another exemplary embodiment of the present invention.

The liquid crystal display according to the exemplary embodiment shown in FIGS. 32, 37, and 38 is approximately the same as the exemplary embodiment shown in FIGS. 32, 33, and 34 as described above, except for the structure of the second passivation layer 180y. For example, as shown in FIGS. 37 and 38, the thickness of the second passivation layer 180y may vary by position. In more detail, the thickness of the portion of the second passivation layer 180y extending along the data line 171 may be thicker than other portions. When the permittivity of the second passivation layer 180y is lowered, the thickness of the second passivation layer 180y may be further reduced, and accordingly, defects in the alignment layer 11 due to steps in the second passivation layer 180y or wiring defects such as disconnections may be prevented.

According to the exemplary embodiment of the present invention, when the thickness of the portion of the second passivation layer 180y extending along the data line 171 is formed thicker than other portions, the delay in data signal due to parasitic capacitance between the data line 171 and the common electrode 131 or between data line 171 and the pixel electrode 191 may be reduced. Further, the absorption of light by the organic second passivation layer 180y may be reduced by reducing the thickness of the portions of the second passivation layer 180y besides those portions extending along the data line 171. For example, the portion disposed where the pixel electrode 191 is formed may be thinned, thereby making it possible to prevent the reduction in transmittance.

In the various exemplary embodiments of the present invention shown in FIGS. 32 to 38, the position of the second passivation layer 180y is not limited to the positions shown, but instead may be disposed in any layer if the second passivation layer 180y is disposed between the data line 171 and the common electrode 131. For example, the layer position of the first passivation layer 180x and the second passivation layer 180y may be switched.

Next, a liquid crystal display according to an exemplary embodiment of the present invention will be described with reference to FIGS. 39, 40, and 41. The same components in the above-mentioned exemplary embodiments are denoted by the same reference numerals, and detailed description thereof will be omitted.

Figure 39:
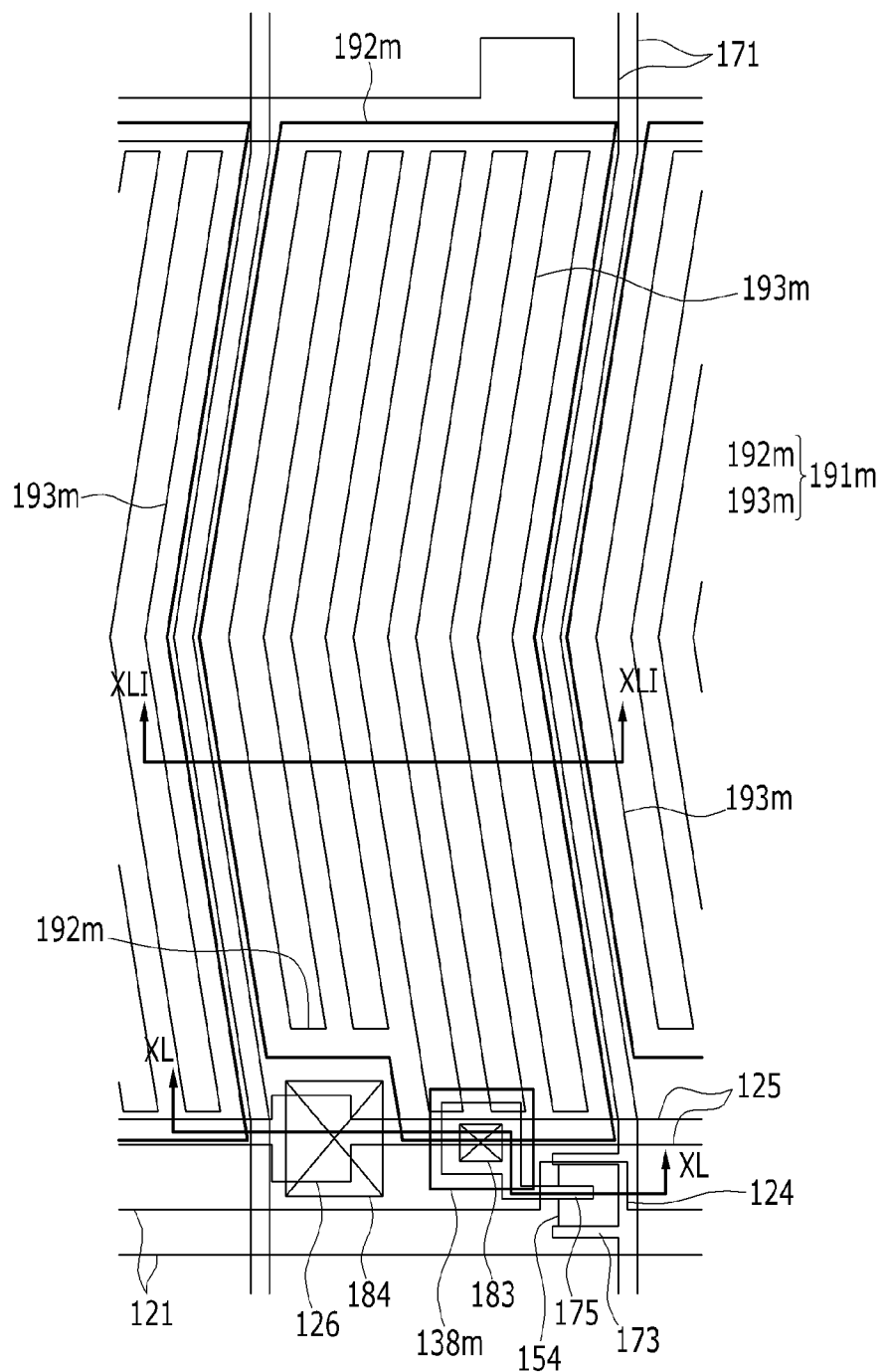
FIG. 39 is a layout view of one pixel of a liquid crystal display according to an exemplary embodiment of the present invention.
Figure 40:
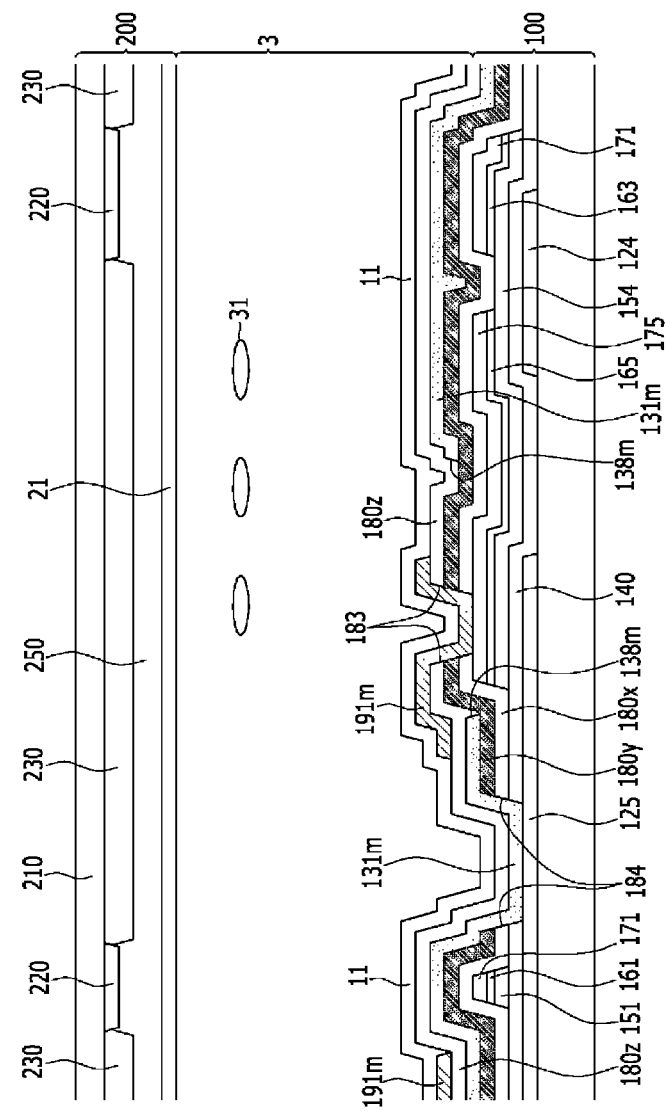
FIGS. 40 and 41 each are cross-sectional views taken along line XL-XL and line XLI-XLI of the liquid crystal display of FIG. 39, according to an exemplary embodiment of the present invention.
Figure 41:
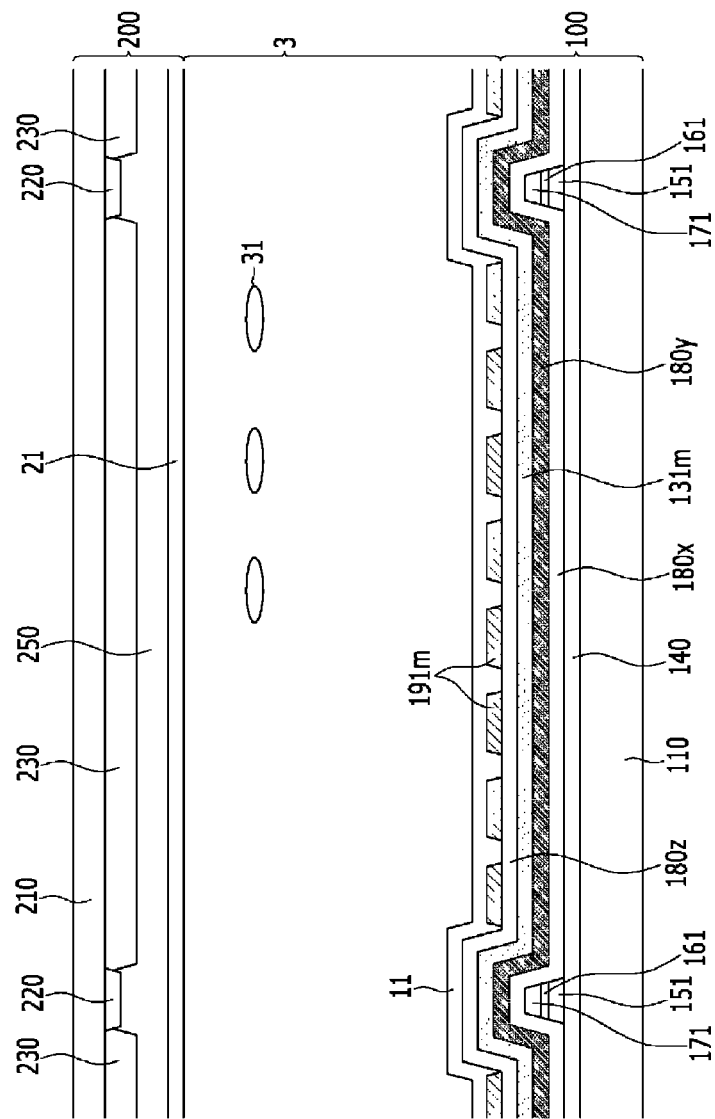

FIG. 39 is a layout view of one pixel of a liquid crystal display according to an exemplary embodiment of the present invention, and FIGS. 40 and 41 each are cross-sectional views taken along line XL-XL and line XLI-XLI of FIG. 39 respectively.

The present exemplary embodiment is approximately the same as the exemplary embodiment shown in FIGS. 32 to 34, except for the structure of the data line 171, the pixel electrode 191, and the common electrode 131. Therefore, discussion focuses primarily on differences from the exemplary embodiments of FIGS. 32 to 34 described above.

The data line 171 according to the present exemplary embodiment of the present invention is periodically bent (i.e. bent in places) and forms an oblique angle with the direction of extension of the gate line 121. The oblique angle of the data line 171 to the extending direction of the gate line 121 may be 45° or more if desired.

The first passivation layer 180x and the second passivation layer 180y are disposed on the data conductors 171 and 175 and the exposed semiconductor protrusion 154. The first passivation layer 180x, the second passivation layer 180y, and the gate insulating layer 140 include contact holes 184 that respectively expose portions of the common voltage line 125. The second passivation layer 180y may include an organic material and have a relative permittivity of 3.5 or less. There may be about 10% deviation in such relative dielectric constant of the second passivation layer 180y depending on the measuring method employed. Representative characteristics of the second passivation layer 180y may be the same as those of the second passivation layer 180y of the exemplary embodiment shown in FIGS. 32 to 34 described above.

A common electrode 131m is disposed on the second passivation layer 180y. The common electrode 131m is electrically connected to the common voltage line 125 through the contact hole 184, to be applied with a predetermined voltage such as the common voltage Vcom from the common voltage line 125. In the present exemplary embodiment, the common electrode 131m, which has an approximately planar shape, may be formed on substantially the entire surface of the substrate 110 as a single platelike structure.

The third passivation layer 180z is disposed on the common electrode 131m and a pixel electrode 191m is disposed thereon. A plurality of contact holes 183 that respectively expose portions of the drain electrode 175 are formed in the first passivation layer 180x, the second passivation layer 180y, and the third passivation layer 180z. The pixel electrode 191m is electrically connected to the drain electrode 175 through the contact hole 183, so as to be supplied with the data voltage. The pixel electrode 191m includes a plurality of branch electrodes 193m extending substantially parallel to each other and spaced apart from each other, and lower and upper horizontal parts 192m that connect the top or bottom end portions of the branch electrodes 193m. The branch electrodes 193m of the pixel electrode 191m may be bent along with the data line 171, as shown.

When a data voltage is applied to pixel electrode 191m, it generates an electric field in the liquid crystal layer 3 together with the common electrode 131m (which has the common voltage applied to it).

The common electrode 131m covers a plurality of data lines 171 at a time and overlaps the data lines 171. Therefore, crosstalk between the data line 171 and the pixel electrode 191 may be reduced, and light leakage due to parasitic capacitance between the data line 171 and the adjacent pixel electrode 191 may also be reduced.

In addition, the organic second passivation layer 180y is disposed between the data line 171 and the common electrode 131m to lower the parasitic capacitance between the data line 171 and the common electrode 131m, thereby making it possible to reduce the signal delay of the data line 171. The thickness of the second passivation layer 180y may be further thinned, and the signal delay of the data line 171 may reduced, by lowering the relative permittivity of the second passivation layer 180y.

Various characteristics and effects of the previous exemplary embodiments shown in FIGS. 32 to 34 may be also applied to the present exemplary embodiment.

Figure 42:
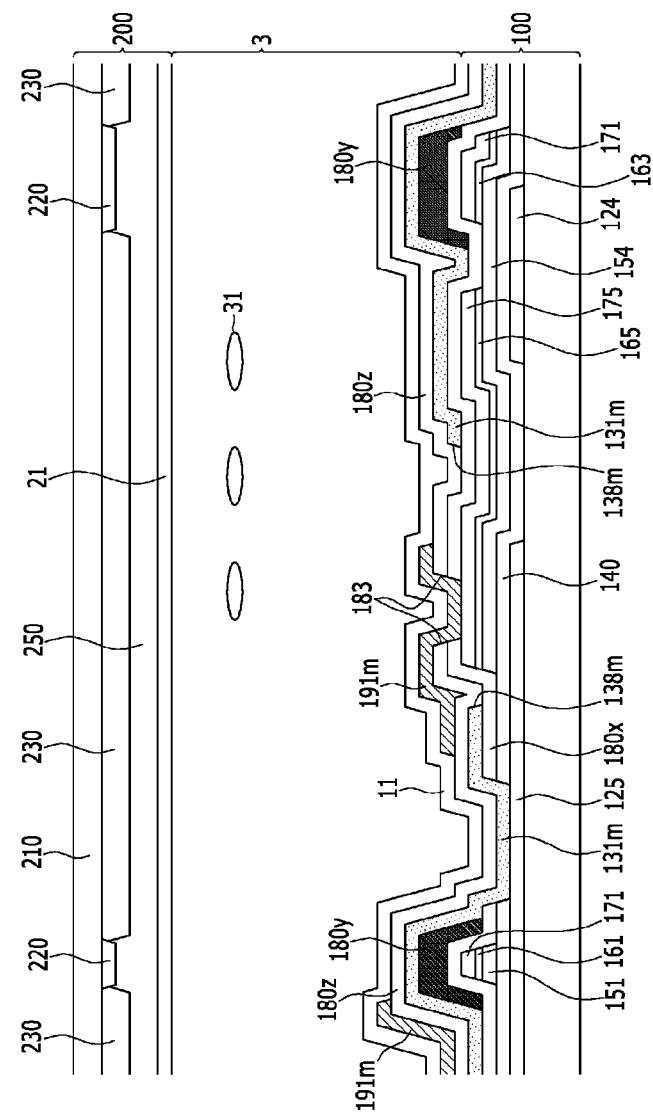
FIGS. 42 and 43 each are cross-sectional views taken along line XL-XL and line XLI-XLI of the liquid crystal display of FIG. 39, according to another exemplary embodiment of the present invention.
Figure 43:
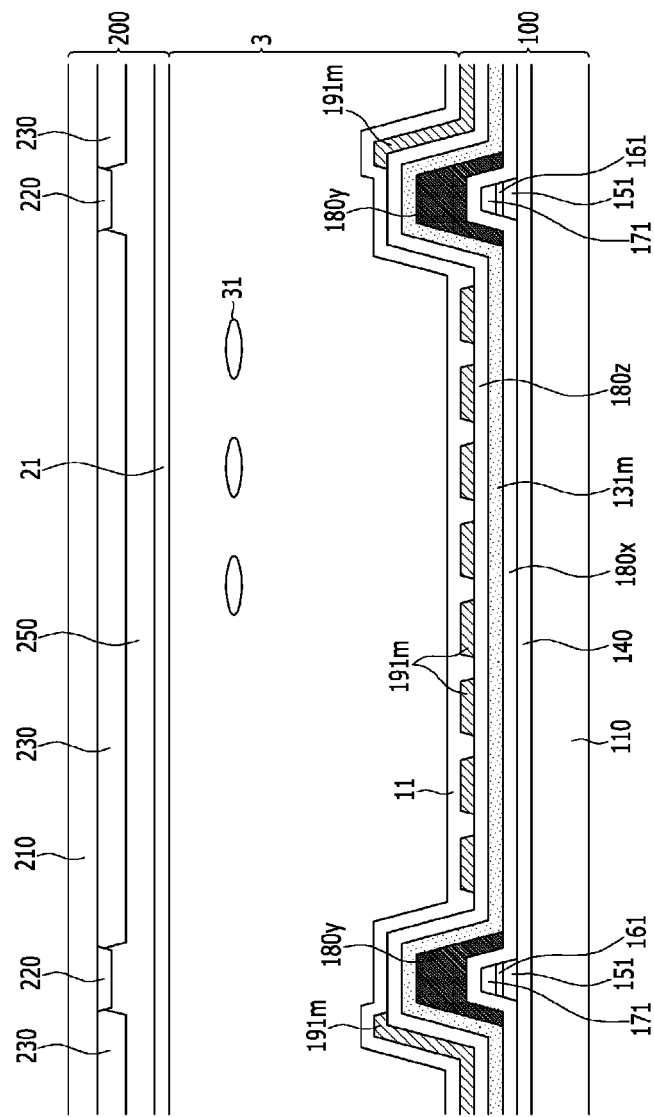

FIGS. 42 and 43 each are cross-sectional views taken along line XL-XL and line XLI-XLI of the liquid crystal display of FIG. 39 respectively, according to another exemplary embodiment of the present invention.

The liquid crystal display according to the exemplary embodiment shown in FIGS. 39, 42, and 43 is approximately the same as the exemplary embodiment shown in FIGS. 39, 40, and 41 as described above, except for the structure of the second passivation layer 180y. For example, as shown in FIGS. 42 and 43, the second passivation layer 180y is not formed on substantially the entire surface of substrate 110, but extends along the data line 171 while covering the data line 171. In this case, the contact holes 181 or the contact holes 183 described above may not be formed in the second passivation layer 180y. As such, the parasitic capacitance between the data line 171 and the common electrode 131 may be lowered by forming the second passivation layer 180y only on the data line 171, thereby making it possible to reduce the signal delay of the data line 171.

Figure 44:
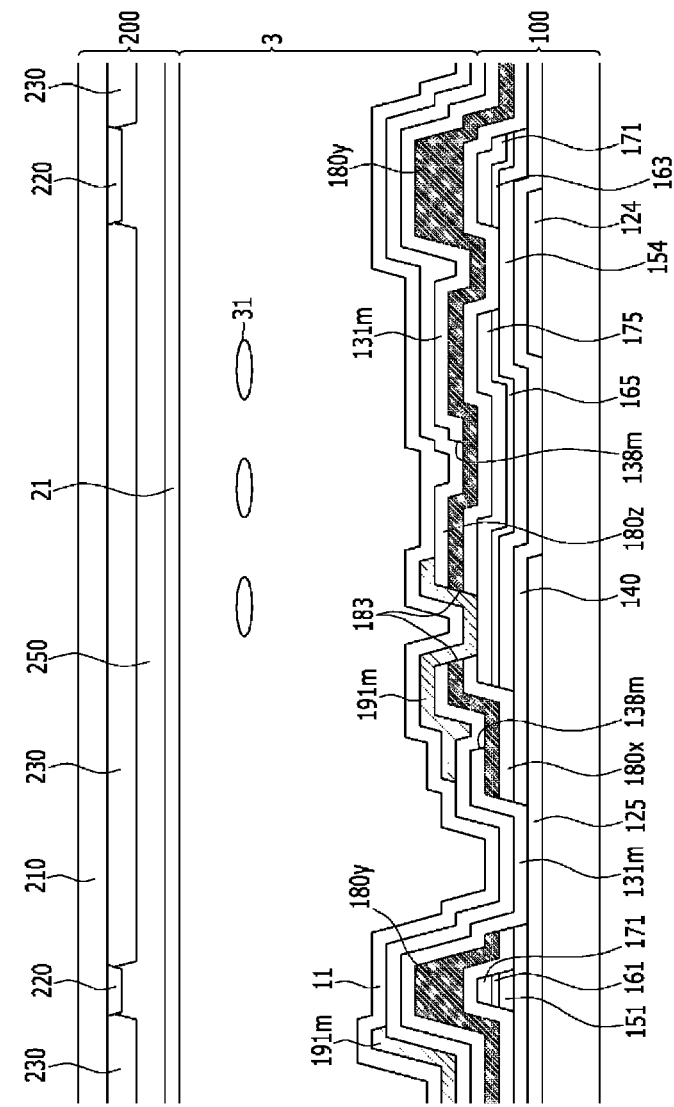
FIGS. 44 and 45 each are cross-sectional views taken along line XL-XL and line XLI-XLI of the liquid crystal display of FIG. 39, according to another exemplary embodiment of the present invention.
Figure 45:
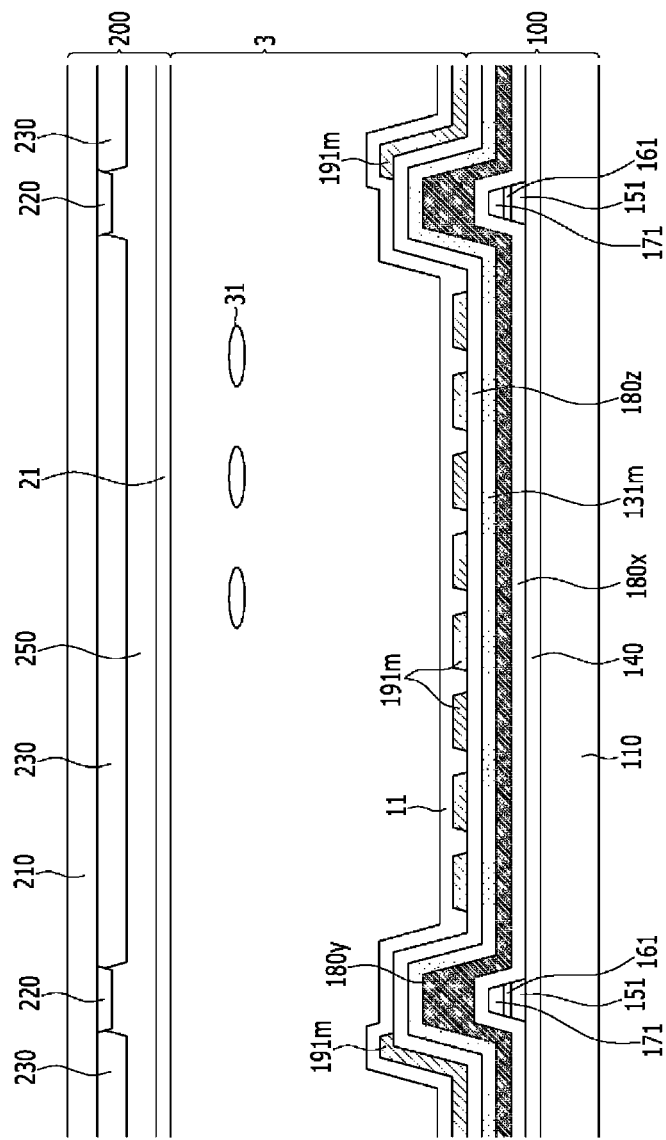

FIGS. 44 and 45 each are cross-sectional views taken along line XL-XL and line XLI-XLI of the liquid crystal display of FIG. 39 respectively, according to another exemplary embodiment of the present invention.

The liquid crystal display according to the present exemplary embodiment shown in FIGS. 39, 44, and 45 is approximately the same as the exemplary embodiment shown in FIGS. 39, 40, and 41 as described above, but the thickness of the second passivation layer 180y may vary by position. For example, the thickness of the portion of the second passivation layer 180y extending along the data line 171 may be relatively thicker than other portions.

In the various exemplary embodiments of the present invention shown in FIGS. 39 to 45, the position of the second passivation layer 180y is not limited to those shown. For example, the layer position of the first passivation layer 180x and the second passivation layer 180y may be switched.

Various characteristics and effects of the exemplary embodiment described above may be also applied to the exemplary embodiment having the same components.

FIGS. 46, 47, 48, 49, and 50 each are layout views of a liquid crystal display according to an exemplary embodiment of the present invention.

Figure 46:
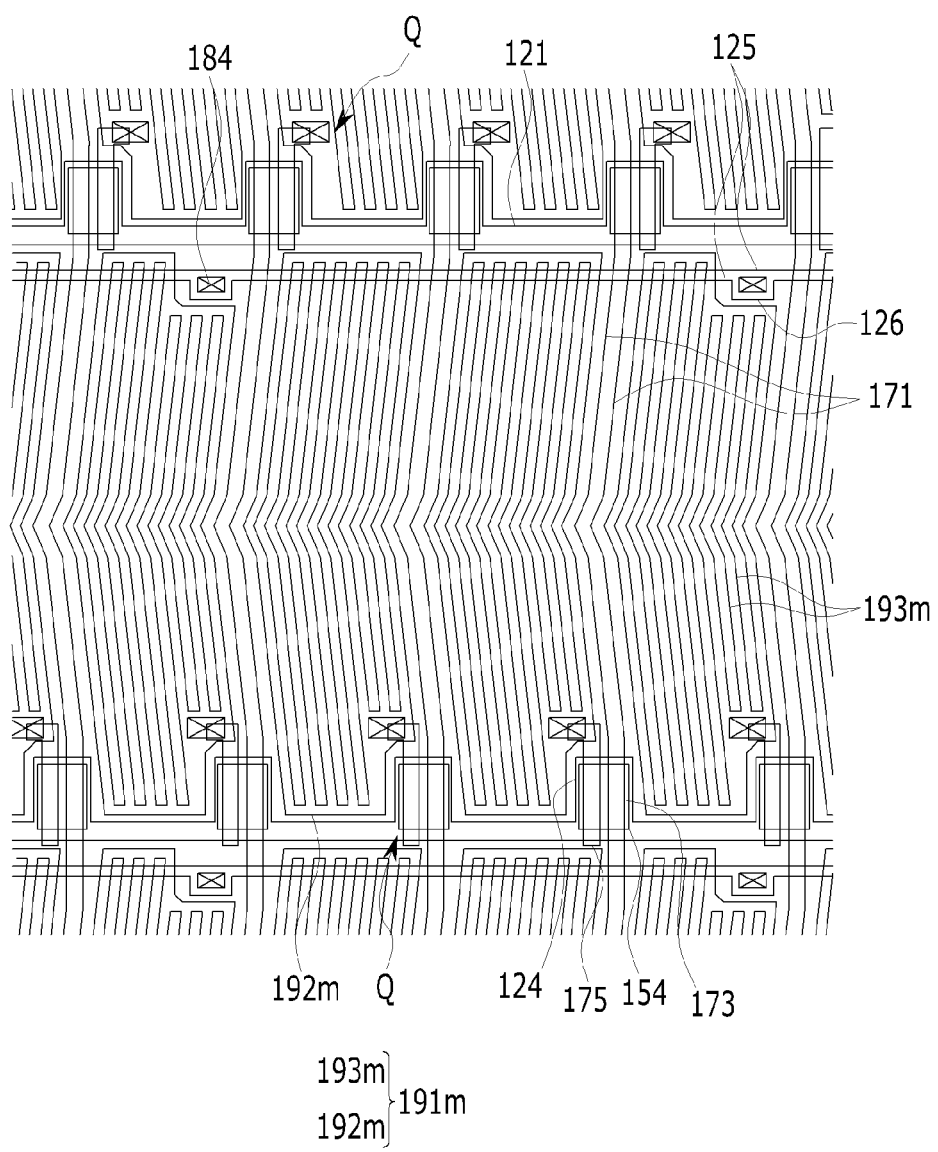
FIGS. 46, 47, 48, 49, and 50 each are layout views of a liquid crystal display according to an exemplary embodiment of the present invention.

First referring to FIG. 46, the liquid crystal display according to the present exemplary embodiment of the present invention is approximately the same as the liquid crystal display shown in FIGS. 39 to 45 described above.

The data line 171 and the pixel electrode 191m of the liquid crystal device according to the present exemplary embodiment may be bent at least once between two adjacent gate lines 121, as shown. In detail, referring to FIG. 46, the data line 171 and the branch electrode 193m of the pixel electrode 191m may be bent approximately at the middle portion between the two adjacent gate lines 121 and may be bent again at two points above and under the bent point of the middle portion. In addition, the data line 171 and the branch electrode 193m of the pixel electrode 191m may be bent in the vicinity of the lower and upper horizontal parts 192m of the pixel electrode 191m. As such, the data line 171 and the branch electrode 193m of the pixel electrode 191m are bent respectively once each in the vicinity of the lower and upper horizontal parts 192m or are bent third times at the middle portion between the two adjacent gate lines 121, thereby making it possible to reduce texture occurring when the inclination direction of the liquid crystal molecules is not controlled.

Figure 47:
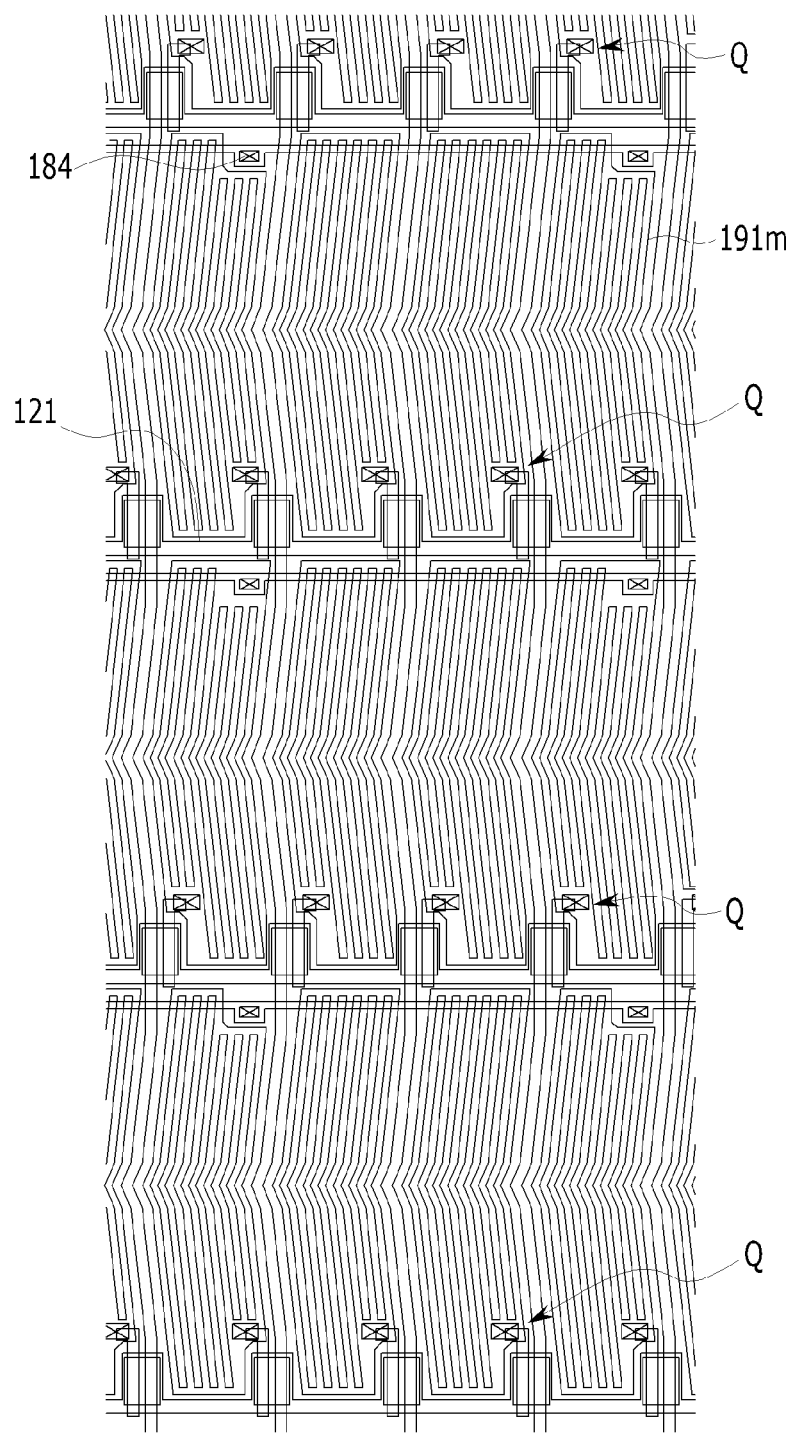

Next, referring to FIG. 47, the liquid crystal display according to the present exemplary embodiment is approximately the same as the liquid crystal display shown in FIG. 46. In the liquid crystal display according to the present exemplary embodiment, each of the different pixel electrodes 191m may have the same shape. For example, all the convex points at the bent portions of the branch electrodes 193m of the pixel electrodes 191m that are adjacent in a row direction or column direction may be disposed at a same side with respect to the pixel electrodes 191m (all the convex points of the branch electrodes 193m face to the left in FIG. 47). Therefore, all of the plurality of data lines 171 may be periodically bent such that the data lines 171 protrude in one direction.

In addition, the liquid crystal display according to the present exemplary embodiment includes thin film transistors positioned both to the left and right of a data line 171. The TFTs positioned at the left side and the TFTs positioned at the right side with respect to the data line 171 may be 1×1 alternately arranged along the column direction. All the TFTs disposed in a single row may be positioned at one side with respect to the data line 171.

In the liquid crystal display according to the present exemplary embodiment, the common electrode (not shown, but the same as the common electrode 131m shown in FIGS. 40 to 45) is connected to the common voltage line 125 through the contact holes 184. As shown in FIG. 47, one or two contact holes 184 may be arranged per three pixel electrodes 191m.

Figure 48:
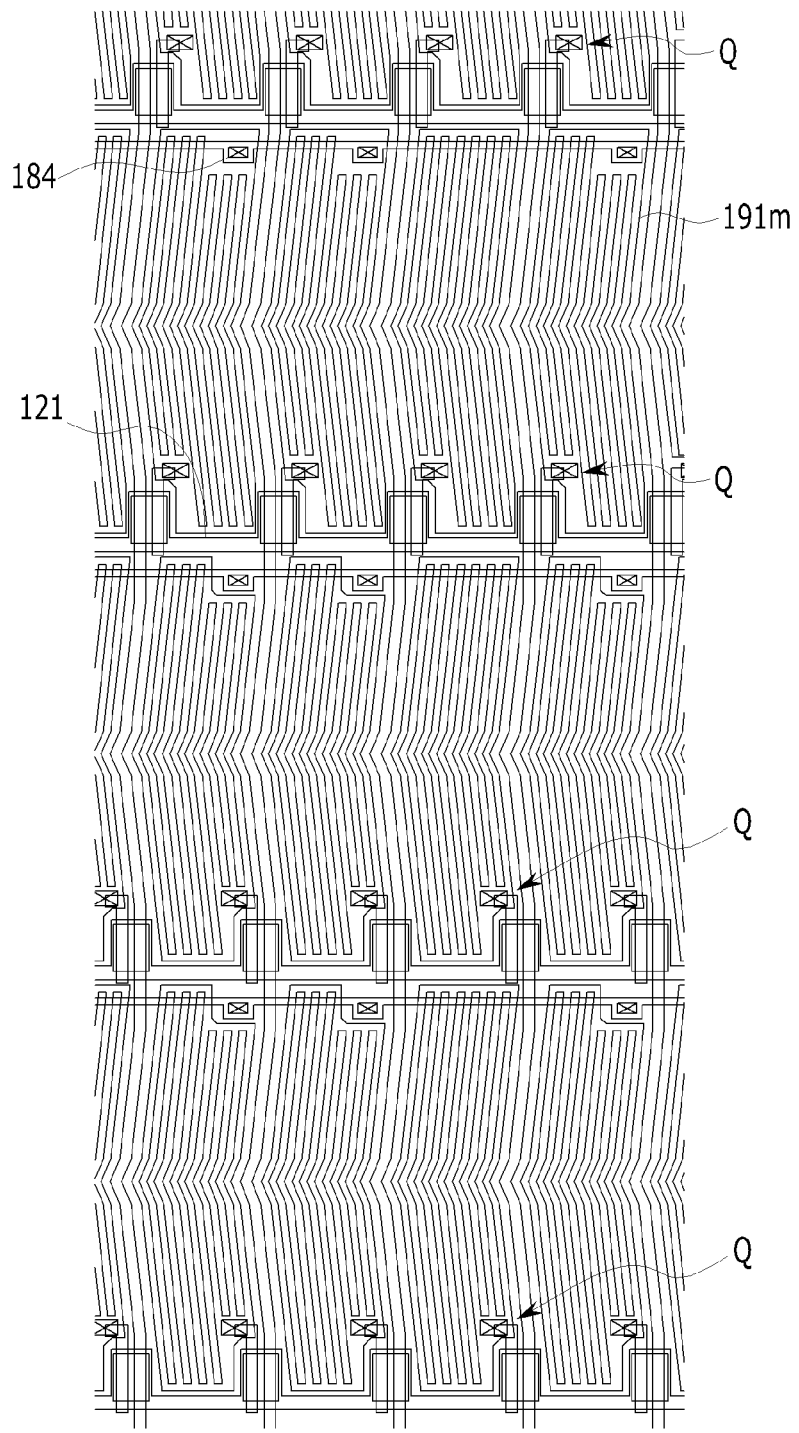

Next, referring to FIG. 48, the liquid crystal display according to the present exemplary embodiment is approximately the same as the liquid crystal display shown in FIG. 47. However, unlike the exemplary embodiment shown in FIG. 47, the TFTs positioned at the left side and the TFTs positioned at the right side with respect to a data line 171 may be arranged 2×2 alternately along the column direction. All the TFTs disposed in a row may be positioned at one side with respect to the data line 171.

Figure 49:
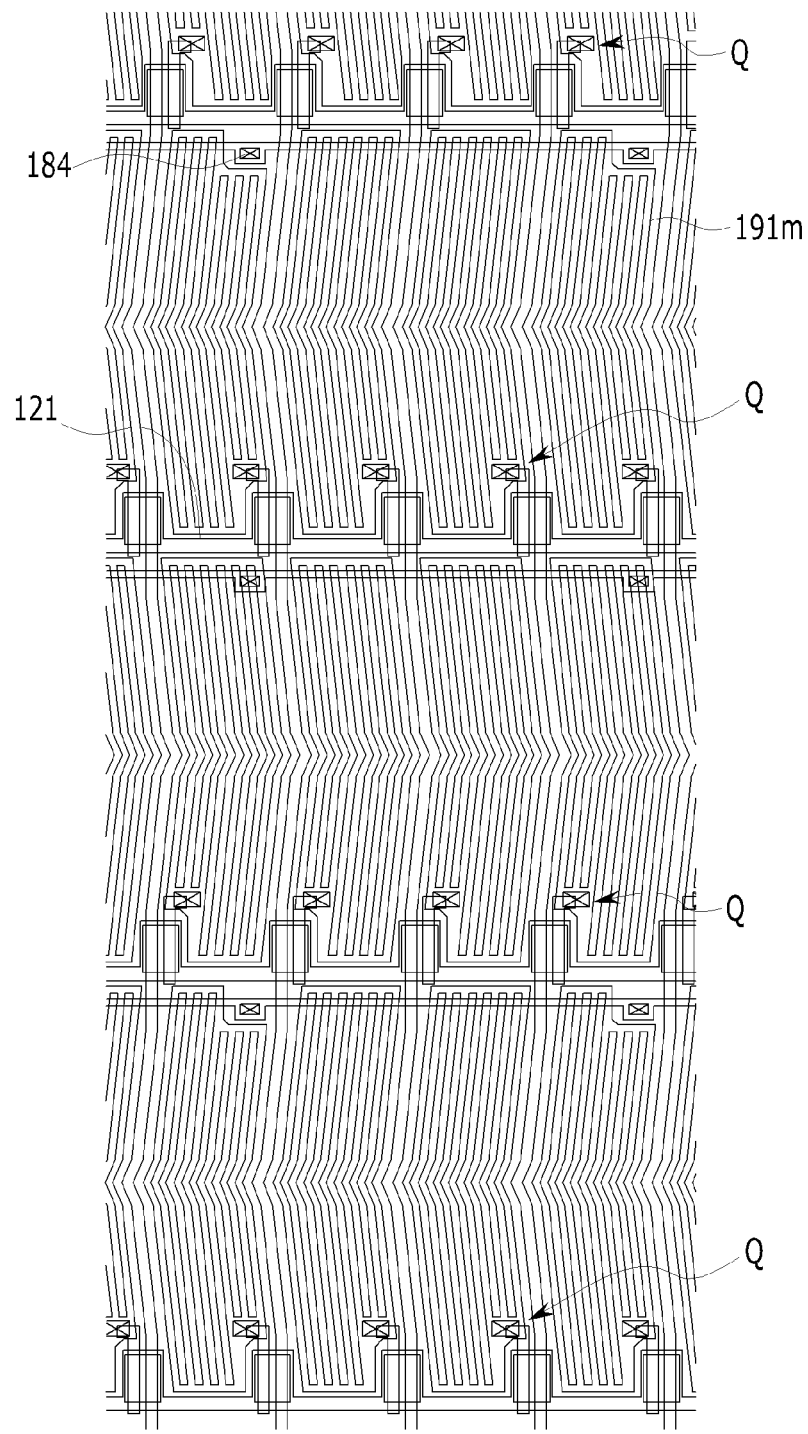

Next, referring to FIG. 49, the liquid crystal display according to the present exemplary embodiment is approximately the same as the liquid crystal display shown in FIG. 47. However, in the present exemplary embodiment of the present invention, the shapes of the pixel electrodes 191m adjacent in the column direction are different from each other. In detail, the bending direction of the branch electrodes 193m of the two pixel electrodes 191m adjacent in a row direction may be different. The pixel electrode 191m having the convex point of the bent portion of the branch electrodes 193m at the left side and the pixel electrode 191m having the convex point at the right side may be 1×1 alternately arranged along the column direction. Therefore, the data line 171 includes a portion bent to the left and a portion bent to the right, that are arranged alternately.

Figure 50:
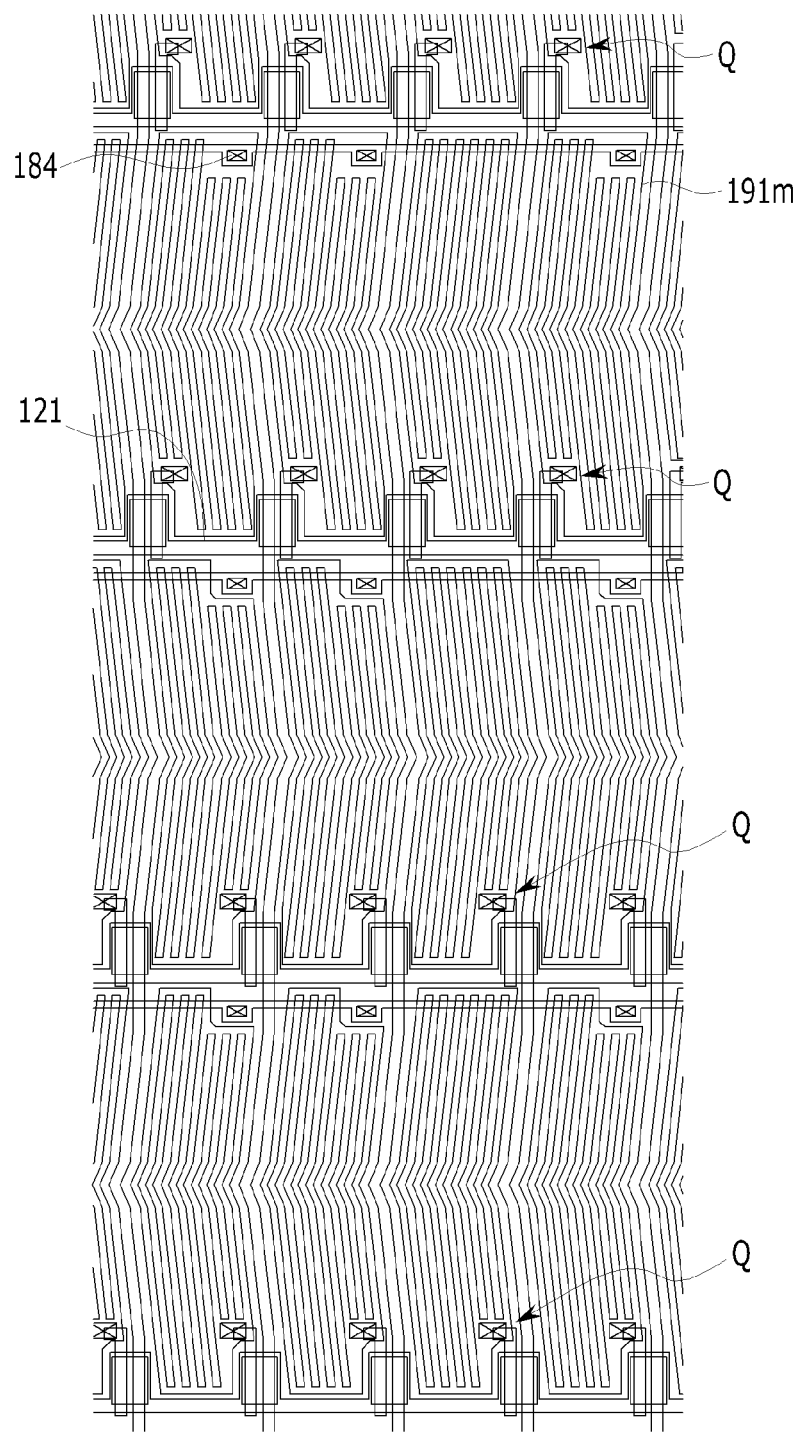

Next, referring to FIG. 50, the liquid crystal display according to the present exemplary embodiment of the present invention is approximately the same as the liquid crystal display shown in FIG. 49. However, unlike the exemplary embodiment shown in FIG. 49, the TFT positioned at the left side and the TFT positioned at the right side with respect to a data line 171 may be arranged 2×2 alternately along the column direction. All the TFTs in a row may be positioned at one side with respect to the data line 171.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

DESCRIPTION OF SYMBOLS

| | |
|---|---|
| 3: Liquid crystal layer | 31: Liquid crystal molecule |
| 110, 210: Substrate | 100, 200: Display panel |
| 121: Gate line | 124: Gate electrode |
| 125: Common voltage line | 131, 131m: Common electrode |
| 140: Gate insulating layer | |
| 151, 154: Semiconductor | 161, 163, 165: Ohmic contact |
| 171: Data line | 173: Source electrode |
| 175: Drain electrode | 180a, 180b, 180c, 180d: Passivation layer |
| 181, 182, 183, 184: Contact hole | 191, 191m: Pixel electrode |
| 131, 131m: Common electrode | 220: Light blocking member |
| 230: Color filter | 250: Overcoat |

What is claimed is:

1. A liquid crystal display, comprising:
a first substrate and a second substrate overlapping each other;
a liquid crystal layer interposed between the first substrate and the second substrate;
a first data line disposed on the first substrate;
a second data line adjacent to the first data line and extending substantially in a same direction as the first data line;
a pixel electrode disposed on the first substrate for receiving a data voltage from the first data line;
a common electrode disposed on the first substrate and overlapping the first data line and at least a portion of the pixel electrode; and
a passivation layer disposed on the first substrate, the passivation layer having a first portion disposed between the common electrode and the first data line in a direction perpendicular to a bottom surface of the first substrate, the passivation layer further having a second portion disposed between the common electrode and the second data line and having a third portion disposed between the first data line and the second data line,
wherein one of the pixel electrode and the common electrode includes a plurality of branch electrodes spaced apart from each other, and the other of the pixel electrode and the common electrode has an at least approximately planar shape that is substantially parallel to a surface of the first substrate or the second substrate,
wherein the third portion overlaps the plurality of branch electrodes,
wherein the layer quantity of the first portion is equal to the layer quantity of the third portion, and
wherein a maximum thickness of the first portion is greater than a maximum thickness of the third portion.

2. The liquid crystal display of claim 1, wherein:
a thickness of the passivation layer is in a range from about 0.5 μm to about 3.0 μm.

3. The liquid crystal display of claim 2, wherein:
the passivation layer includes an organic material.

4. The liquid crystal display of claim 3, wherein
the first portion and the second portion are spaced apart from each other.

5. The liquid crystal display of claim 3,
wherein the second data line is formed of a same data conductor material as the first data line.

6. The liquid crystal display of claim 1, wherein:
the passivation layer includes an organic material.

7. The liquid crystal display of claim 1, wherein the first portion and the second portion are spaced apart from each other.

8. The liquid crystal display of claim 1, wherein:
at least one of the pixel electrode and the common electrode includes a transparent conductive material.

9. A liquid crystal display, comprising:
a first substrate and a second substrate overlapping each other;
a liquid crystal layer interposed between the first substrate and the second substrate;
a first data line disposed on the first substrate;
a second data line adjacent to the first data line and extending substantially in a same direction as the first data line;
a common electrode disposed on the first data line and overlapping the first data line, the common electrode having an at least approximately planar shape that is substantially parallel to a surface of at least one of the first substrate and the second substrate;
a pixel electrode overlapping the common electrode for receiving a data voltage from the first data line, the pixel electrode including a plurality of branch electrodes spaced apart from each other; and
a passivation layer disposed on the first substrate, the passivation layer having a first portion disposed between the first data line and the common electrode in a direction perpendicular to a bottom surface of the first substrate, the passivation layer further having a second portion disposed between the common electrode and the second data line and having a third portion disposed between the first data line and the second data line, wherein the third portion overlaps the plurality of branch electrodes,
wherein the layer quantity of the first portion is equal to the layer quantity of the third portion, and
wherein a maximum thickness of the first portion is greater than a maximum thickness of the third portion.

10. The liquid crystal display of claim 9, wherein:
a thickness of the passivation layer is in a range from about 0.5 µm to about 3.0 µm.

11. The liquid crystal display of claim 10, wherein:
the passivation layer includes an organic material.

12. The liquid crystal display of claim 11, wherein:
the second data line is formed of a same data conductor material as the first data line,
the passivation layer further includes a second portion disposed between the common electrode and the second data line, and
the first portion and the second portion are spaced apart from each other.

13. The liquid crystal display of claim 9, wherein:
the passivation layer includes an organic material.

14. A liquid crystal display, comprising:
a first substrate and a second substrate overlapping each other;
a liquid crystal layer interposed between the first substrate and the second substrate;
a first data line disposed on the first substrate;
a second data line adjacent to the first data line and extending substantially in a same direction as the first data line;
a common electrode disposed on the first substrate and overlapping the first data line;
a passivation layer disposed on the first substrate, the passivation layer having a first portion disposed between the first data line and the common electrode in a direction perpendicular to a bottom surface of the first substrate, the passivation layer further having a second portion disposed between the common electrode and the second data line and having a third portion disposed between the first data line and the second data line; and
a pixel electrode disposed on the common electrode for receiving a data voltage from the first data line, the pixel electrode including a plurality of branch electrodes spaced apart from each other,
wherein the third portion overlaps the plurality of branch electrodes,
wherein the layer quantity of the first portion is equal to the layer quantity of the third portion, and
wherein a maximum thickness of the first portion is greater than a maximum thickness of the third portion.

15. The liquid crystal display of claim 14, wherein the passivation layer comprises an organic material.

16. The liquid crystal display of claim 15, wherein
the passivation layer has a dielectric constant of about 3.5 or less.

17. The liquid crystal display of claim 16, wherein:
a thickness of the passivation layer is in a range from about 0.5 µm to about 3.0 µm.

18. The liquid crystal display of claim 15,
wherein the first portion and the second portion are spaced apart from each other.

19. The liquid crystal display of claim 14, wherein
the third portion connects the first portion and the second portion so that the passivation layer at least partially covers the first data line and the second data line.

20. The liquid crystal display of claim 14, further comprising:
a light blocking member disposed on the second substrate.

21. The liquid crystal display of claim 20, wherein
the light blocking member is positioned between two adjacent pixel electrodes, the two adjacent pixel electrodes being disposed on opposing sides of the first data line.

22. The liquid crystal display of claim 21, wherein
a width of the light blocking member is equal to or less than a distance between the two adjacent pixel electrodes.

23. The liquid crystal display of claim 14, wherein
the common electrode has an at least approximately planar shape that is substantially parallel to a surface of at least one of the first substrate and the second substrate.

24. A liquid crystal display, comprising:
a first substrate and a second substrate overlapping each other;
a liquid crystal layer disposed between the first substrate and the second substrate;
a first data line disposed on the first substrate;
a second data line adjacent to the first data line and extending substantially in a same direction as the first data line;
a first pixel electrode disposed on the first substrate and in electrical communication with the first data line so as to be configured to receive a data voltage from the first data line;
a common electrode disposed on the first substrate and overlapping the pixel electrode and the first data line; and
a first passivation layer disposed on the first data line and including an organic material,
wherein one of the first pixel electrode and the common electrode includes a plurality of branch electrodes spaced apart from each other, and the other of the first pixel electrode and the common electrode has an at least approximately planar shape that is substantially parallel to a surface of at least one of the first substrate and the second substrate,
wherein the first passivation layer includes a first portion covering a surface of the first data line that overlaps the first substrate in a direction perpendicular to a bottom surface of the first substrate,
wherein the first passivation layer further includes a second portion covering the second data line,
wherein the first passivation layer further includes a third portion disposed between the first data line and the second data line,
wherein the third portion overlaps the plurality of branch electrodes,
wherein the layer quantity of the first portion is equal to the layer quantity of the third portion, and
wherein a maximum thickness of the first portion is greater than a maximum thickness of the third portion.

25. The liquid crystal display of claim 24, wherein
the first portion and the second portion are spaced apart from each other.

26. The liquid crystal display of claim 25, wherein the first passivation layer is disposed between the first data line and the common electrode.

27. The liquid crystal display of claim 26, further comprising:
a second pixel electrode adjacent to the first pixel electrode, and
a light blocking member that covers an area between the first pixel electrode and the second pixel electrode.

28. The liquid crystal display of claim 27, wherein a portion of the light blocking member positioned between the first pixel electrode and the second pixel electrode has a width that is equal to or smaller than a distance between the first pixel electrode and the second pixel electrode.

29. The liquid crystal display of claim 24, further comprising:
a second pixel electrode adjacent to the first pixel electrode, and
a light blocking member that covers an area between the first pixel electrode and the second pixel electrode.

30. The liquid crystal display of claim 29, wherein a portion of the light blocking member positioned between the first pixel electrode and the second pixel electrode has a width that is equal to or smaller than a distance between the first pixel electrode and the second pixel electrode.

31. The liquid crystal display of claim 24, wherein the first passivation layer is disposed between the first data line and the common electrode.

32. The liquid crystal display of claim 31, wherein the first pixel electrode is disposed on the common electrode, and
the first pixel electrode includes a plurality of branch electrodes and the common electrode has an at least approximately planar shape that is substantially parallel to a surface of at least one of the first substrate and the second substrate.

33. The liquid crystal display of claim 24, wherein the first pixel electrode is disposed on the common electrode, and the first pixel electrode includes a plurality of branch electrodes and the common electrode has an at least approximately planar shape that is substantially parallel to a surface of at least one of the first substrate and the second substrate.

34. The liquid crystal display of claim 24, wherein a thickness of the first passivation layer is in a range from about 0.5 μm to about 3.0 μm.

35. The liquid crystal display of claim 1, wherein a dielectric constant of the passivation layer is 3.5 or less.

36. The liquid crystal display of claim 1, wherein the first portion and the third portion consist of a same material, or wherein each of the first portion and the third portion includes two layers.

37. The liquid crystal display of claim 1, further comprising an insulating material layer disposed between the first portion and the first data line in the direction perpendicular to the bottom surface of the first substrate.

38. The liquid crystal display of claim 37, wherein a dielectric constant of the passivation layer is lower than a dielectric constant of the insulating material layer.

* * * * *